United States Patent
Liu et al.

(10) Patent No.: US 11,870,397 B2
(45) Date of Patent: Jan. 9, 2024

(54) RADIO FREQUENCY MODULE AND ASSOCIATED METHOD WITH ENVELOPE TRACKING POWER SUPPLY

(71) Applicant: MEDIATEK Inc., Hsin-Chu (TW)

(72) Inventors: Shi-Wen Liu, Hsinchu (TW);
Tang-Nian Luo, Hsinchu (TW);
Chi-Tsan Chen, Hsinchu (TW);
Chi-Kun Chiu, Hsinchu (TW);
Jiann-Huang Liu, Hsinchu (TW);
Peng-Ta Huang, Hsinchu (TW);
Chi-Sheng Yu, Hsinchu (TW);
Hua-Shan Chou, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 31 days.

(21) Appl. No.: 17/674,985

(22) Filed: Feb. 18, 2022

(65) Prior Publication Data
US 2023/0268887 A1    Aug. 24, 2023

(51) Int. Cl.
*H03F 1/02* (2006.01)
*H03F 3/24* (2006.01)
*H04B 7/06* (2006.01)

(52) U.S. Cl.
CPC .......... *H03F 1/0233* (2013.01); *H03F 3/245* (2013.01); *H04B 7/0602* (2013.01); *H03F 2200/105* (2013.01); *H03F 2200/451* (2013.01)

(58) Field of Classification Search
CPC ..... H03F 1/00; H03F 1/02; H03F 1/32; H03F 1/0233; H03F 3/19; H03F 3/21; H03F 3/24; H03F 3/195; H03F 3/245; H03F 2200/451; H04B 1/00; H04B 1/04; H04B 1/16; H04B 7/06; H04B 7/0602; H04B 15/00; H04W 52/02; H04W 52/52; H04W 52/0251; H04W 88/06
USPC .......... 370/210, 311, 319; 375/219, 295–299
See application file for complete search history.

(56) References Cited

U.S. PATENT DOCUMENTS

| | | | |
|---|---|---|---|
| 11,018,638 B2 * | 5/2021 | Khlat | H03F 3/19 |
| 2017/0179887 A1 | 6/2017 | Henzler | |
| 2018/0152144 A1 * | 5/2018 | Choo | H03F 3/211 |
| 2020/0287577 A1 | 9/2020 | Hitomi | |
| 2021/0075372 A1 * | 3/2021 | Henzler | H03F 3/189 |

* cited by examiner

*Primary Examiner* — Shawkat M Ali
(74) *Attorney, Agent, or Firm* — McClure, Qualey & Rodack, LLP

(57) ABSTRACT

The invention provides a radio frequency (RF) module and associated method with envelope tracking (ET) power supply in a device. The RF module may comprise a plurality of transmitters, an ET output, and an ET multiplexer. Each said transmitter may comprise an ET port and one or more RF outputs, and may be configured for providing an RF signal to one of said one or more RF outputs, and providing an ET signal, which reflects an envelope of the RF signal, to the ET port. The ET multiplexer may be coupled between said ET ports of the plurality of transmitters and the ET output, for selectively relaying one of said ET ports to the ET output.

20 Claims, 27 Drawing Sheets

US 11,870,397 B2

1

RADIO FREQUENCY MODULE AND ASSOCIATED METHOD WITH ENVELOPE TRACKING POWER SUPPLY

FIELD OF THE INVENTION

The invention relates to a radio frequency (RF) module and associated method with envelope tracking (ET) power supply in a device, and more particularly, to an RF module and associated method involving an ET multiplexer coupled between an ET module (ETM) and a plurality of transmitters for selectively relaying one of the transmitters to the ETM.

BACKGROUND OF THE INVENTION

Wireless connection/telecommunication functionality is essential for modern electronic device. To implement wireless functionality, a device includes a transmitter, a power amplifier (PA), a power source and an antenna; when the device desires to wirelessly transmit (upload, upstream, uplink, etc.) contents (e.g., packets), the transmitter processes the contents to provide an RF signal, the power source supplies power to the PA, the PA amplifies the RF signal and accordingly feeds the antenna, and the antenna forms corresponding outgoing electromagnetic waves.

To implement more advanced wireless functionality, such as multi-input multi-output (MIMO), carrier aggregation (CA) and/or E-UTRAN new radio dual connectivity (ENDC), a device includes a plurality of transmitters, a plurality of PAs and a plurality of antennas. Consequently, how to supply the plurality of PAs is a main concern of modern wireless development.

An ETM which operates based on ET power supply technology can be utilized as a power source. For a PA which amplifies an RF signal, the ETM supplies the PA with time-varying power which tracks an instantaneous envelope of the RF signal. To cooperate with the ETM, the transmitter which provides the RF signal to be amplified by the PA will also provide an ET signal, which reflects the envelope of the RF signal, to the ETM, so the ETM is able to modulate the supplied power according to the ET signal. In other words, to correctly supply a PA to amplify an RF signal of a transmitter, the ETM needs an ET signal, which reflects an envelope of the RF signal, from the transmitter.

Comparing to other power supply technology, adopting the ET power supply technology by utilizing ETM to supply PA is technically beneficial, but is also of high cost. Therefore, there needs a more flexible solution to improve usage of ET power supply technology.

SUMMARY OF THE INVENTION

An object of the invention is providing an RF module (e.g., 100 in FIGS. 1a to 4a, or 200 in FIGS. 5a and 6) with improved usage of ET power supply in a device (e.g., e.g., 1000, 2000, 3000, 4000 or 5000 in FIG. 1a, 2a, 3a, 4a or 5a). The RF module may comprise a plurality of transmitters (e.g., tx1 and tx2 in FIGS. 1a to 4a, or tx1 to tx3 in FIGS. 5a and 6), an ET output (e.g., eo1 in FIGS. 1a to 5a and 6) and an ET multiplexer (e.g., 10 in FIGS. 1a to 4a, or 20 in FIGS. 5a and 6). Each said transmitter (e.g., one of tx1 and tx2 in FIGS. 1a to 4a, or one of tx1 to tx3 in FIGS. 5a and 6) may comprise an ET port (e.g., one of ep1 and ep2 in FIGS. 1a to 4a, or one of ep1 to ep3 in FIGS. 5a and 6) and one or more RF outputs (e.g., o11 to o16 or o21 to o26 in FIGS. 1a to 4a; or o11 to o17, o21 to o25, or o31 to o36 in FIGS. 5a and 6), and may be configured for providing an RF signal (e.g., one of rf11 and rf12, rf21 and rf22 in FIGS. 1a to 4a, or one of rf11 to rf13, rf21 and rf 22, rf31 and rf32 in FIGS. 5a and 6) to one of said one or more RF outputs, and providing an ET signal (e.g., one of et1 and et2 in FIGS. 1a to 4a, or one of et1 to et3 in FIGS. 5a and 6), which may reflect an envelope of the RF signal, to the ET port. The ET multiplexer may be coupled between said ET ports (e.g., ep1 and ep2 in FIGS. 1a to 4a, or ep1 to ep3 in FIGS. 5a and 6) of the plurality of transmitters and the ET output (e.g., eo1 in FIGS. 1a to 5a and 6), and may selectively relay (e.g., conduct, pass, forward, link, electrically connect, etc.) one of said ET ports to the ET output.

In an embodiment, the ET multiplexer may relay different ones (e.g., ep1 and ep2) of said ET ports to the ET output during different time intervals (e.g., as shown in FIGS. 1b and 1c, 2b and 2c, or 5b and 5c).

In an embodiment (e.g., FIGS. 1a to 5a and 6), the RF module may further comprise one or more additional ET outputs (e.g., eo2 in FIGS. 1a to 4a, or eo2 and eo3 in FIGS. 5a and 6), wherein each said additional ET output may be coupled to one (e.g., ep2 in FIGS. 1a to 5a and 6, or ep3 in FIGS. 5a and 6) of said ET ports.

In an embodiment (e.g., FIGS. 1a to 5a), the plurality of transmitters may include a first transmitter (e.g., tx1 in FIGS. 1a to 5a) which may comprise a first ET port (e.g., ep1 in FIGS. 1a to 5a) and a first RF output (one of o11 to o16 in FIGS. 1a to 4a, or one of o11 to o17 in FIG. 5a). The device may further comprise an ETM (e.g., 110 in FIGS. 1a to 5a) and a first PA (e.g., one of a1, a2 and a5 in FIGS. 1a to 3a, one of a1 and a2 in FIG. 4a, or one of a7 to a11 in FIG. 5a). The ETM may comprise an ET input (e.g., ei1 in FIGS. 1a to 5a) and a first power output (e.g., po1 in FIGS. 1a to 5a), and may supply power to the first power output according to signal obtained from the ET input; the ET input may be coupled to the ET output of the RF module. The first PA may comprise a first RF input (e.g., one of i1, i2 and i5 in FIGS. 1a to 3a, one of i1 and i2 in FIG. 4a, or one of i7 to i11 in FIG. 5a) and a first power input (e.g., one of pi1, pi2 and pi5 in FIGS. 1a to 3a, one of pi1 and pi2 in FIG. 4a, or one of pi7 to pi11 in FIG. 5a) respectively coupled to the first RF output of the first transmitter and the first power output of the ETM, and may amplify signal obtained from the first RF input by consuming power supplied from the first power input. During a first time interval (e.g., as shown in one of FIGS. 1b, 1e, 2b, 2d, 3b, 3d, 4b, 4d, 5b and 5e), the first transmitter may provide a first RF signal (e.g., rf12 in FIGS. 1b, 2b, 3b and 5b, rf11 in FIGS. 1e, 2d, 3d, 4b and 4d, or rf13 in FIG. 5e) to the first RF output (e.g., o13 in FIGS. 1b, 2b, 3b and 5b, o11 in FIG. 1e, o12 in FIGS. 2d, 3d, 4b and 4d, or o17 in FIG. 5e), and may provide a first ET signal (e.g., et1 in FIGS. 1b, 1e, 2b, 2d, 3b, 3d, 4b, 4d, 5b and 5e), which may reflect an envelope of the first RF signal, to the first ET port; and the ET multiplexer may relay the first ET port of the first transmitter to the ET output.

In an embodiment (e.g., FIGS. 1a to 5a), the plurality of transmitters may further include a second transmitter (e.g., tx2 in FIGS. 1a to 5a) which comprises a second ET port (e.g., ep2 in FIGS. 1a to 5a) and a second RF output (e.g., one of o21 to o26 in FIGS. 1a to 4a, or one of o21 to o25 in FIG. 5a). The device may further comprise a second PA (e.g., one of a3 and a4 in FIGS. 1a to 3a, one of a3 to a5 in FIG. 4a, or a12 in FIG. 5a); the second PA may comprise a second RF input (e.g., one of i3 and 4 in FIGS. 1a to 3a, one of i3 to i5 in FIG. 4a, or i12 in FIG. 5a) and a second power input (e.g., one of pi3 and pi4 in FIGS. 1a to 3a, one of pi3 to pi5 in FIG. 4a, or pi12 in FIG. 5a), and may amplify signal obtained from the second RF input by consuming power supplied from the second power input. The second RF input of the second PA may be coupled to the second RF output of the second transmitter. During a second time interval (e.g., as shown in one of FIGS. 1c, 1d, 2c, 2e, 3c, 3e, 4c, 4e, 5c and 5f), the second transmitter may provide a second RF signal (e.g., rf21 in FIGS. 1c, 1d, 2c, 2e, 3c, 3e, 4c and 4e, or rf22 in FIGS. 5c and 5f) to the second RF output (e.g., o23 in FIGS. 1c, 2c, 2e, 3c, 4e, 5c and 5f, o22 in FIGS. 1d and 3e, or o21 in FIG. 4c).

In an embodiment (e.g., FIGS. 5a and 6), the plurality of transmitters may further include a third transmitter (e.g., tx3 in FIGS. 5a and 6) which may comprise a third ET port (e.g., ep3 in FIGS. 5a and 6) and a third RF output (e.g., one of o31 to o36 in FIGS. 5a and 6). The ET multiplexer (e.g., 20 in FIGS. 5a and 6) may be coupled between the first ET port, the second ET port and the third ET port and the ET output, for selectively relaying one of the first ET port, the second ET port and the third ET port to the ET output.

In an embodiment (e.g., FIG. 6), the ET multiplexer may comprise a first ET switch (e.g., ew1 in FIG. 6), a second ET switch (e.g., ew2 in FIG. 6) and a two-to-one multiplexing unit (e.g., m1 in FIG. 6). The two-to-one multiplexing unit may comprise a first multiplexing input port (e.g., na1), a second multiplexing input port (e.g., nb1) and a multiplexing output port (e.g., nc1), and may selectively relay one of the first multiplexing input port and the second multiplexing input port to the multiplexing output port. The multiplexing output port (e.g., nc1) may be coupled to the ET output (e.g., eo1). The first multiplexing input port (e.g., na1) may be coupled to the first ET port (e.g., ep1). The first ET switch may be coupled between the second ET port (e.g., ep2) and the second multiplexing input port (e.g., nb1). The second ET switch may be coupled between the third ET port (e.g., ep3) and the second multiplexing input port (e.g., nb1). The first ET switch and the second ET switch may not be closed concurrently.

In an embodiment (e.g., FIGS. 1a, 2a and 5a), the second power input (e.g., one of pi3 and pi4 in FIGS. 1a and 2a, or pi12 in FIG. 5a) of the second PA may be coupled to the first power output (e.g., po1) of the ETM. During the first time interval (e.g., as shown in one of FIGS. 1b, 1e, 2b, 5b and 5e), the second transmitter may be disabled. During the second time interval (e.g., as shown in one of FIGS. 1c, 1d, 2c, 5c and 5f), the first transmitter may be disabled, the second transmitter may further provide a second ET signal (e.g., et2 in FIGS. 1c, 1d, 2c, 5c and 5f), which may reflect an envelope of the second RF signal, to the second ET port, and the ET multiplexer may relay the second ET port of the second transmitter to the ET output.

In an embodiment, during the first time interval (e.g., as shown in one of FIGS. 2d, 3d and 4d), the second transmitter may provide the second RF signal (e.g., rf21 in FIGS. 2d, 3d and 4d) to the second RF output (e.g., o23 in FIGS. 2d and 3d, or o21 in FIG. 4d).

In an embodiment (e.g., FIGS. 2a, 3a and 4a), the device may further comprise a second power source (e.g., 130 in FIG. 2a, or 120 in FIGS. 3a and 4a). The second power source may comprise a second power output (e.g., po3 in FIG. 2a, or po2 in FIGS. 3a and 4a), and may supply power to the second power output. The second power output of the second power source may be coupled to the second power input (e.g., one of pi3 and pi4 in FIGS. 2a and 3a, or one of pi3 to pi5 in FIG. 4a) of the second PA (e.g., one of a3 and a4 in FIGS. 2a and 3a, or one of a3 to a5 in FIG. 4a). In an embodiment (e.g., FIG. 2a), the second power source may be a power management integrated circuit (PMIC).

In an embodiment (e.g., FIGS. 3a and 4a), the RF module may further comprise a second ET output (e.g., eo2) coupled to the second ET port (e.g., ep2). The second power source may be a second ETM which may further comprise a second ET input (e.g., ei2 in FIGS. 3a and 4a) coupled to the second ET output of the RF module, and may supply power to the second power output according to signal obtained from the second ET input. During the first time interval (e.g., as shown in one of FIGS. 3d and 4d), the second transmitter may further provide a second ET signal (e.g., et2), which may reflect the envelope of the second RF signal, to the second ET port.

In an embodiment (e.g., FIG. 2a), the device may further comprise a power switch (e.g., one of w3 and w4 in FIG. 2a). The power switch may be coupled between the first power output (e.g., po1) of the ETM, the second power output (e.g., po3 in FIG. 2a) of the second power source (e.g., 130 in FIG. 2a) and the second power input (e.g., pi3 or pi4 in FIG. 2a) of the second PA (e.g., a3 or a4 in FIG. 2a), and may selectively relay one of the first power output and the second power output to the second power input. During the first time interval (e.g., as shown in FIG. 2d), the power switch (e.g., w4 in FIG. 2d) may relay the second power output (e.g., po3 in FIG. 2d) of the second power source to the second power input (e.g., pi4) of the second PA (e.g., a4). During the second time interval (e.g., as shown in FIG. 2c), the power switch (e.g., w4 in FIG. 2c) may relay the first power output (e.g., po1 in FIG. 2c) of the ETM to the second power input (e.g., pi4) of the second PA (e.g., a4), and the ET multiplexer may relay the second ET port (e.g., ep2) to the ET output (e.g., eo1).

In an embodiment (e.g., FIGS. 1a to 5a and 6), each transmitter (e.g., one of tx1 to tx3) may further comprise a digital frontend (DFE, e.g., one of ca1 to ca3) for processing a content signal (e.g., one of s1 to s3) to form a preliminary transmitting signal (e.g., one of sa1 to sa3) and a preliminary tracking signal (e.g., one of sc1 to sc3) which may track an envelope of the preliminary transmitting signal; an RF circuit (e.g., one of cb1 to cb3) coupled to the DFE, for processing the preliminary transmitting signal to form an intermediate transmitting signal (e.g., one of sb1 to sb3); an internal amplifier (e.g., one of u11 to u13, u21 to u22 and u31 to u32) coupled to the RF circuit for amplifying the intermediate transmitting signal to form the RF signal; an ET circuit (e.g., one of cd1 to cd3) coupled to the DFE, for processing the preliminary tracking signal to form an intermediate tracking signal (e.g., one of sd1 to sd3); and an ET digital-to-analog converter (ET DAC, e.g., one of ce1 to ce3) coupled between the ET circuit and the ET port, for converting the intermediate tracking signal to the ET signal.

An object of the invention is providing a method (e.g., as shown in one of FIGS. 1b to 1e, 2b to 2e, 3b to 3e, 4b to 4e and 5b to 5f) for improving usage of ET power supply in a device (e.g., 1000, 2000, 3000, 4000 or 5000 in FIG. 1a, 2a, 3a, 4a or 5a). The device may comprise an RF module (e.g., 100 in FIGS. 1a to 4a, or 200 in FIG. 5a), an ETM (e.g., 110 in FIGS. 1a to 5a), a first PA (e.g., a1, a2 or a5 in FIGS. 1a to 3a, a1 or a2 in FIG. 4a, or one of a7 to a11 in FIG. 5a) and a second PA (e.g., a3 or a4 in FIGS. 1a to 3a, one of a3 to a5 in FIG. 4a, or a12 in FIG. 5a). The RF module may comprise a plurality of transmitters (e.g., tx1 and tx2 in FIGS. 1a to 4a, or tx1 to tx3 in FIG. 5a), an ET output (e.g., eo1 in FIGS. 1a to 5a) and an ET multiplexer (e.g., 10 in FIGS. 1a to 4a, or 20 in FIG. 5a). Each said transmitter (e.g., tx1 or tx2 in FIGS. 1a to 5a, or tx3 in FIG. 5a) may comprise an ET port (e.g., ep1 or ep2 in FIGS. 1a to 5a, or ep3 in FIG. 5a). The ET multiplexer being coupled between the ET output of the RF module and said ET ports of the plurality of transmitters. The ETM may supply power according to signal obtained from the ET output. The plurality of transmitters may include a first transmitter (e.g., tx1 in FIGS. 1a to 5a) and a second transmitter (e.g., tx2 in FIGS. 1a to 5a) which may comprise a first ET port (e.g., ep1 in FIGS. 1a to 5a) and a second ET port (e.g., ep2 in FIGS. 1a to 5a) respectively. The method may comprise: during a first time interval (e.g., as shown in one of FIGS. 1b, 1e, 2b, 2d, 3b, 3d, 4b, 4d, 5b and 5e), by the first transmitter, providing a first RF signal (e.g., rf12 in FIGS. 1b, 2b, 3b and 5b, rf11 in FIGS. 1e, 2d, 3d, 4b and 4d, or rf13 in FIG. 5e) to the first PA (e.g., a5 in FIGS. 1b, 2b and 3b, a1 in FIG. 1e, a2 in FIGS. 2d, 3d, 4b and 4d, a7 in FIG. 5b, or a11 in FIG. 5e) to be amplified, and providing a first ET signal (e.g., et1 in FIGS. 1b, 1e, 2b, 2d, 3b, 3d, 4b, 4d, 5b and 5e), which may reflect an envelope of the first RF signal, to the first ET port; and, by the ET multiplexer, relaying the first ET port of the first transmitter to the ET output to cause the ETM to supply the first PA according to the first ET signal; during a second time interval (e.g., as shown in one of FIGS. 1c, 1d, 2c, 2e, 3c, 3e, 4c, 4e, 5c and 5f), by the second transmitter, providing a second RF signal (e.g., rf21 in FIGS. 1c, 1d, 2c, 2e, 3c, 3e, 4c and 4e, or rf22 in FIGS. 5c and 5f) to the second PA (e.g., a4 in FIGS. 1c, 2c, 2e, 3c and 4e, a3 in FIGS. 1d and 3e, a5 in FIG. 4c, or a12 in FIGS. 5c and 5f) to be amplified.

In an embodiment, the plurality of transmitters may further include a third transmitter (e.g., tx3 in FIG. 5a) which may comprise a third ET port (e.g., ep3 in FIG. 5a). The method may further comprise: during different time intervals (e.g., as shown in FIGS. 5b and 5c), by the ET multiplexer, relaying different ones (e.g., ep1 and ep2 in FIGS. 5b and 5c) of the first ET port, the second ET port and the third ET port to the ET output.

In an embodiment, the method may further comprise: during the first time interval (e.g., as shown in one of FIGS. 1b, 1e, 2b, 5b and 5e), disabling the second transmitter, and, during the second time interval (e.g., as shown in one of FIGS. 1c, 1d, 2c, 5c and 5f), disabling the first transmitter; and, by the second transmitter, further providing a second ET signal (e.g., et2, in FIGS. 1c, 1d, 2c, 5c and 5f), which may reflect an envelope of the second RF signal, to the second ET port; and, by the ET multiplexer, relaying the second ET port of the second transmitter to the ET output to cause the ETM to supply the second PA according to the second ET signal.

In an embodiment, the method may further comprise: during the first time interval (e.g., as shown in one of FIGS. 2d, 3d and 4d), by the second transmitter, providing the second RF signal (e.g., rf21) to the second PA (e.g., a4 in FIGS. 2d and 3d, or a5 in FIG. 4d) to be amplified.

In an embodiment, the device may further comprise a second power source (e.g., 130 in FIG. 2a, or 120 in FIGS. 3a and 4a) which may supply the second PA (e.g., a4 in FIGS. 2d and 3d, or a5 in FIG. 4d) during the first time interval (e.g., as shown in one of FIGS. 2d, 3d and 4d).

In an embodiment, the device may further comprise a power switch (e.g., w3 or w4 in FIGS. 2a and 4a) coupled between the ETM, the second power source and the second PA (e.g., a3 or a4 in FIGS. 2a and 4a). During the first time interval (as shown in FIG. 2d), the power switch (e.g., w4 in FIG. 2d) may relay the second power source to the second PA (e.g., a4 in FIG. 2d) to supply the second PA. During the second time interval (as shown in FIG. 2c), the power switch may relay the ETM to the second PA to supply the second PA. The method may further comprise: during the second time interval (as shown in FIG. 2c), by the second transmitter, further providing a second ET signal (e.g., et2 in FIG. 2c), which may reflect an envelope of the second RF signal, to the second ET port; and, by the ET multiplexer, relaying the second ET port of the second transmitter to the ET output to cause the ETM to supply the second PA according to the second ET signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6 illustrates an implementation example of the RF module shown in FIG. 5a.

DETAILED DESCRIPTION OF PREFERRED EMBODIMENTS

Figure 1A:
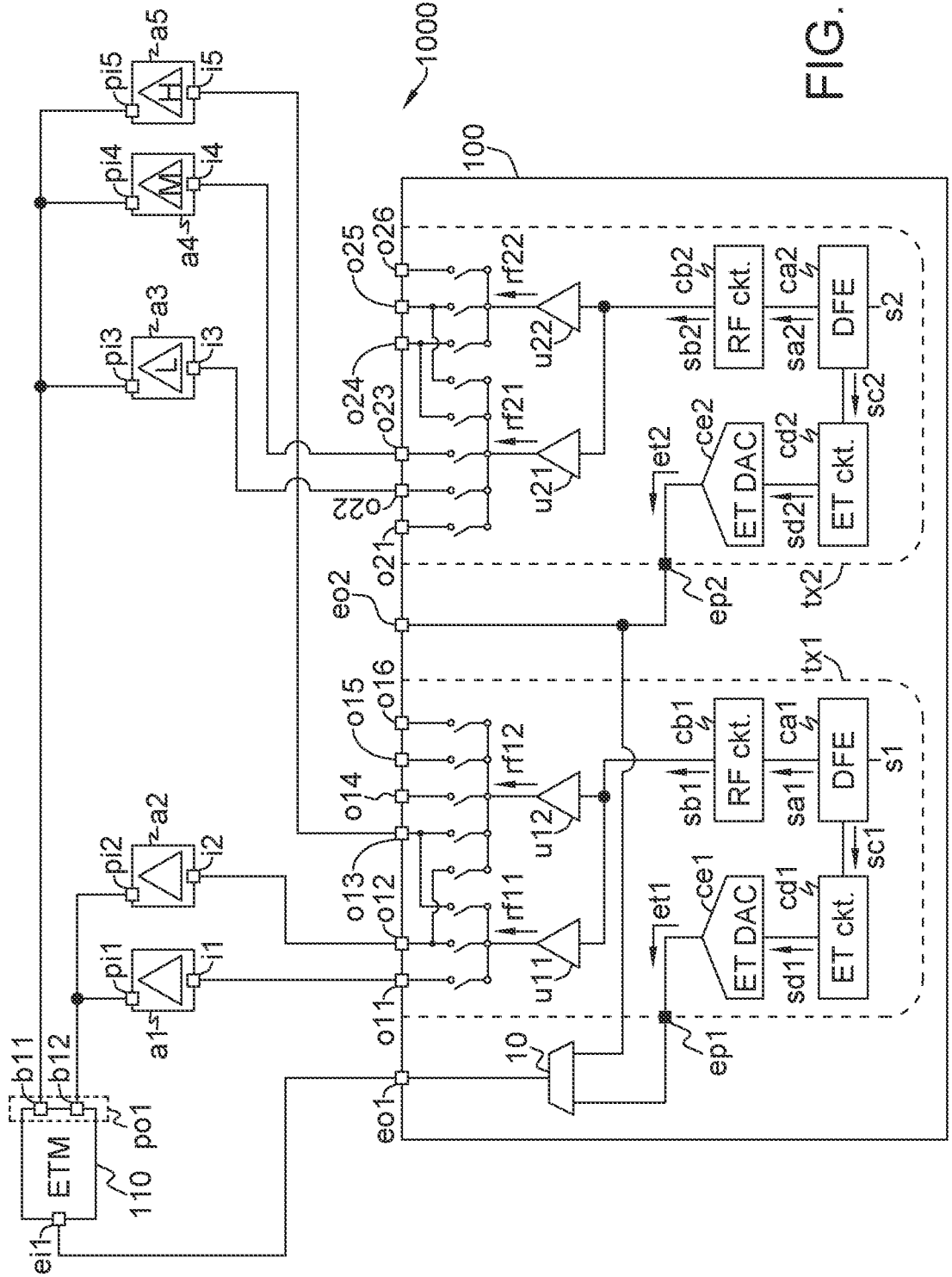
FIG. 1a illustrates a device comprising an RF module according to an embodiment of the invention.

FIG. 1a illustrates a device 1000 comprising an RF module 100 according to an embodiment of the invention, and FIGS. 1b to 1e illustrate operations of the device 1000 according to embodiments of the invention. The device 1000 may be an electronic device or a user equipment (UE) with wireless functionality; for example, the device 1000 may be a wearable gadget, a mobile phone, a smart phone, a game console, a tablet computer, a notebook computer, a wireless network interface card, a router, a set-top box, a digital camera, a camcorder, a drone, a smart speaker, a smart television, a smart consumer electronic or an automobile electronic, etc. The RF module 100 may be a transceiver packaged in a semiconductor chip, e.g., in an integrated circuit (IC). As shown in FIG. 1a, besides the RF module 100, the device 1000 may further comprise an ETM 110 and PAs alto a5.

The RF module 100 may comprise two transmitters tx1 and tx2, two ET outputs eo1 and eo2, and an ET multiplexer 10. The RF module 100 may further comprise other circuits, such as receiver(s), etc., which are not illustrated for conciseness.

In the RF module 100, each transmitter tx #, for #=1 to 2, may comprise an ET port ep #, a DFE ca #, an RF circuit cb #, an ET circuit cd # and an ET DAC ce #; the RF circuit cb # may be coupled to the DFE ca #, the ET circuit cd # may be coupled to the DFE ca #, and the ET DAC ce # may be coupled between the ET circuit cd # and the ET port ep #.

The transmitter tx1 may further comprise internal amplifiers u11 and u12, and RF outputs o11 to o16; the internal amplifier u11 may be coupled between the RF circuit cb1 and the RF outputs o11 to o13, and the internal amplifier u12 may be coupled between the RF circuit cb1 and the RF outputs o12 to o16. The transmitter tx2 may further comprise internal amplifiers u21 and u22, and RF outputs o21 to o26; the internal amplifier u21 may be coupled between the RF circuit cb2 and the RF outputs o21 to o25, and the internal amplifier u22 may be coupled between the RF circuit cb2 and the RF outputs o24 to o26. In an embodiment, each of the internal amplifiers u11 to u12 and u21 to u22 may be a variable gain amplifier (VGA).

Each transmitter tx #, for #=1 to 2, may be enabled and disabled; when the transmitter tx # is enabled, the DFE ca # may process a content signal s #, which may include contents desired to be transmitted, to form a digital preliminary transmitting signal sa #; and, if necessary (e.g., for cooperation of ET power supply), to further form a digital preliminary tracking signal sc # which tracks an envelope of the digital preliminary transmitting signal sa #. In the transmitter tx #, the RF circuit cb # may process the digital preliminary transmitting signal sa # to form an analog intermediate transmitting signal sb #, the ET circuit cd # may process the digital preliminary tracking signal sc # to form a digital intermediate tracking signal sd #, and the ET DAC ce # may convert the digital intermediate tracking signal sd # to an analog ET signal et #. For example, in an embodiment, the DFE ca # may map digital contents in the signal s # to symbols, and may transform the symbols to digital baseband waveform of the signal sa # and, if necessary, to digital baseband waveform of the signal sc #; the RF circuit cb # may upconvert the digital signal sa # to the analog RF signal sb #; the ET circuit cd # may adjust (e.g., scaling, etc.) digital waveform of the signal sc # to form digital waveform of the signal sd #.

Furthermore, when the transmitter tx1 is enabled, the internal amplifier u11 may amplify the analog intermediate transmitting signal sb1 to form an RF signal rf11, or the internal amplifier u12 may amplify the analog intermediate transmitting signal sb1 to form an RF signal rf12. Hence, when the transmitter tx1 is enabled, the transmitter tx1 may provide the RF signal rf11 to one of the RF outputs o11 and o13, or the RF signal rf12 to one of the RF outputs o12 to o16; if necessary, the transmitter tx1 may also provide the ET signal et1, which reflects an envelope of the RF signal rf11 or rf12, to the ET port ep1. In an embodiment, the RF signals rf11 and rf12 may be signals at different RF bands. When the transmitter tx1 is disabled, the transmitter tx1 may not provide the RF signals rf11 and rf12, and may not provide the ET signal et1.

When the transmitter tx2 is enabled, the internal amplifier u21 may amplify the analog intermediate transmitting signal sb2 to form an RF signal rf21, or the internal amplifier u22 may amplify the analog intermediate transmitting signal sb2 to form an RF signal rf22. Hence, when the transmitter tx2 is enabled, the transmitter tx2 may provide the RF signal rf21 to one of the RF outputs o21 to o25, or the RF signal rf22 to one of the RF outputs o24 to o26; if necessary, the transmitter tx2 may also provide the ET signal et2, which reflects an envelope of the RF signal rf21 or rf22, to the ET port ep2. In an embodiment, the RF signals rf21 and rf22 may be signals at different RF bands. When the transmitter tx2 is disabled, the transmitter tx2 may not provide the RF signals rf21 and rf22, and may not provide the ET signal et2.

In the RF module 100, the ET multiplexer 10 may be coupled between the ET output eo1 and the ET ports ep1 and ep2 of the transmitters tx1 and tx2, and may selectively relay (conduct, electrically connect, etc.) one of the ET ports ep1 and ep2 to the ET output eo1. The ET output eo2 may be coupled to the ET port ep2.

In the device 1000, the ETM 110 may comprise an ET input ei1 and a power output po1, and may supply power to the power output po1 according to signal obtained from the ET input ei1; the ET input ei1 may be coupled to the ET output eo1 of the RF module 100. As shown in FIG. 1a, in an embodiment, the power output po1 may comprise two power pin sets b11 and b12; the power pin set b11 may comprise one or more power pins (or solder balls, not shown), and the power pin set b12 may comprise one or more power pins (not shown).

In the device 1000, each PA a #, for #=1 to 5, may comprise an RF input i # and a power input pi #, and may amplify signal obtained from the RF input i # by consuming power supplied from the power input pi #; each PA may also comprise an RF output for outputting the amplified RF signal (e.g., to an antenna), but the RF output is not illustrated for conciseness. As shown in FIG. 1a, the power inputs pi1 and pi2 of the PAs a1 and a2 may be coupled to the power pin set b12 of the power output po1, and the power inputs pi3 to pi5 of the PAs a3 to a5 may be coupled to the power pin set b11 of the power output po1. The RF inputs i1, i2 and i5 of the PAs a1, a2 and a5 may be respectively coupled to the RF outputs o11, o12 and o13 of the transmitter tx1, and the RF inputs i3 and 4 of the PAs a3 and a4 may be respectively coupled to the RF outputs o22 and o23 of the transmitter tx2.

In an embodiment, each of the signals rf11, rf12, rf21, rf22, et1 and et2 may include two signal components (not illustrated), such as an in-phase component and a quadrature-phase component. Each of the RF outputs o11 to o16 and o21 to o26, as well as the RF inputs i1 to i5, may include two external pins (or solder balls, not shown for conciseness) respectively connecting associated two insulated metal traces on a printed circuit board (PCB, not shown) for the two signal components of the RF signal rf11, rf12, rf21 or rf22. Each of the ET outputs eo1 and eo2 and the ET inputs ei1 may include two external pins (or solder balls) respectively connecting associated two insulated metal traces on the PCB for the two signal components of the ET signal et1 or et2. Similarly, the ET port ep1 may include two internal nodes respectively for the two signal components of the ET signal et1, and the ET port ep2 may include two internal nodes respectively for the two signal components of the signal et2. The ET multiplexer 10 may selectively relay the two internal nodes of the ET port ep1 or ep2 to the two external pins (solder balls) of the ET output eo1.

Figure 1B:
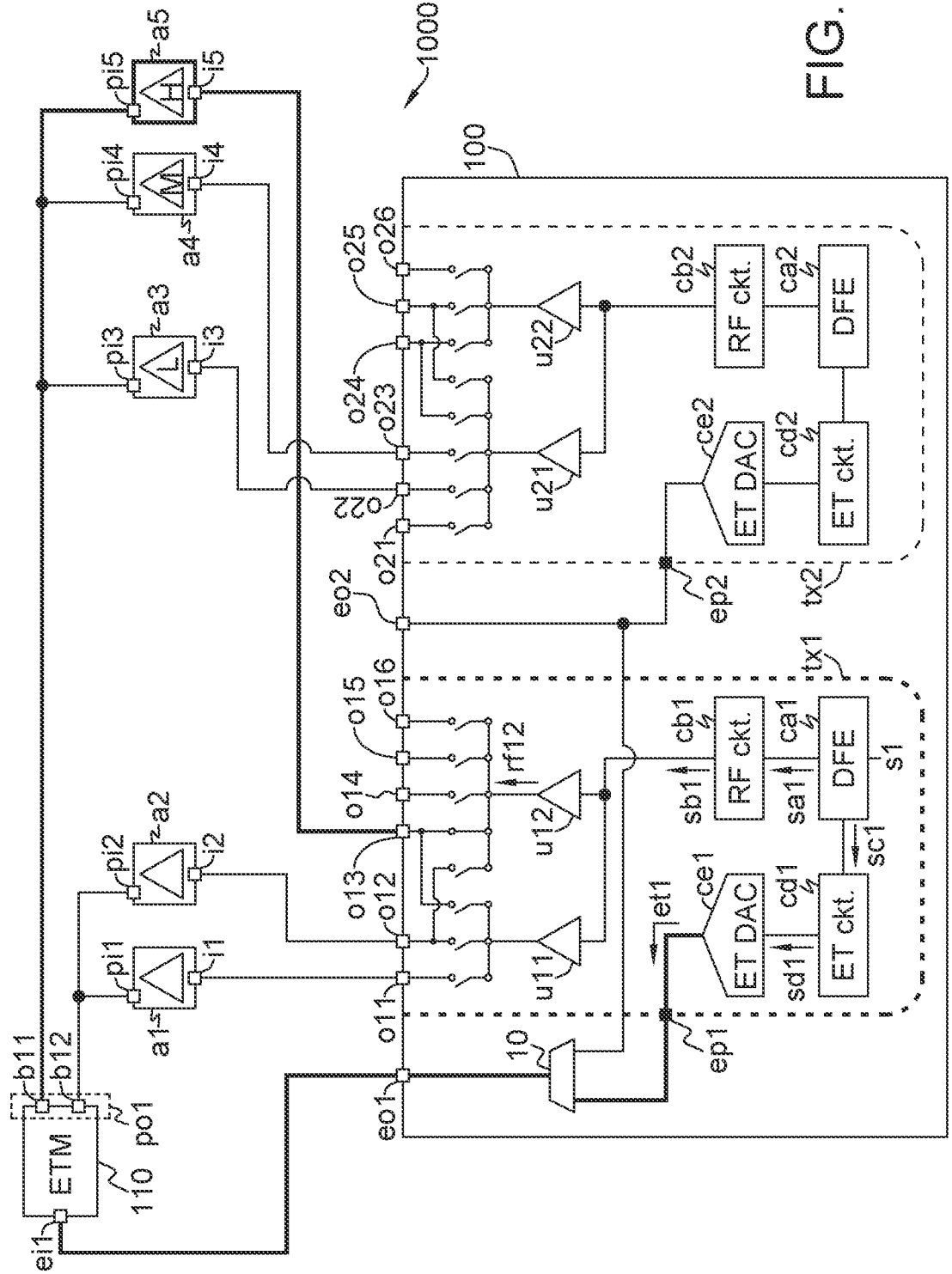
FIGS. 1b to 1e illustrate operations of the device shown in FIG. 1a according to embodiments of the invention.

As shown in FIG. 1b, during a first time interval (e.g., a first transmitting mode, transmitting configuration, transmitting scheme or transmitting scenario, etc.), the transmitter tx1 may be enabled, may therefore provide the RF signal rf12 to the RF output o13 to be amplified by the PA a5, and may provide the ET signal et1, which may reflect an envelope of the RF signal rf12, to the ET port ep1; the ET multiplexer 10 may relay the ET port ep1 to the ET output eo1, so the ET signal et1 may reach the ET input ei1 via the ET port ep1, the ET multiplexer 10 and the ET output eo1. Accordingly, the ETM 110 may supply the PA a5 to amplify the RF signal rf12 of the transmitter tx1 with power which may track the envelope of the RF signal rf12. During the first time interval, the transmitter tx2 may be disabled.

Figure 1C:
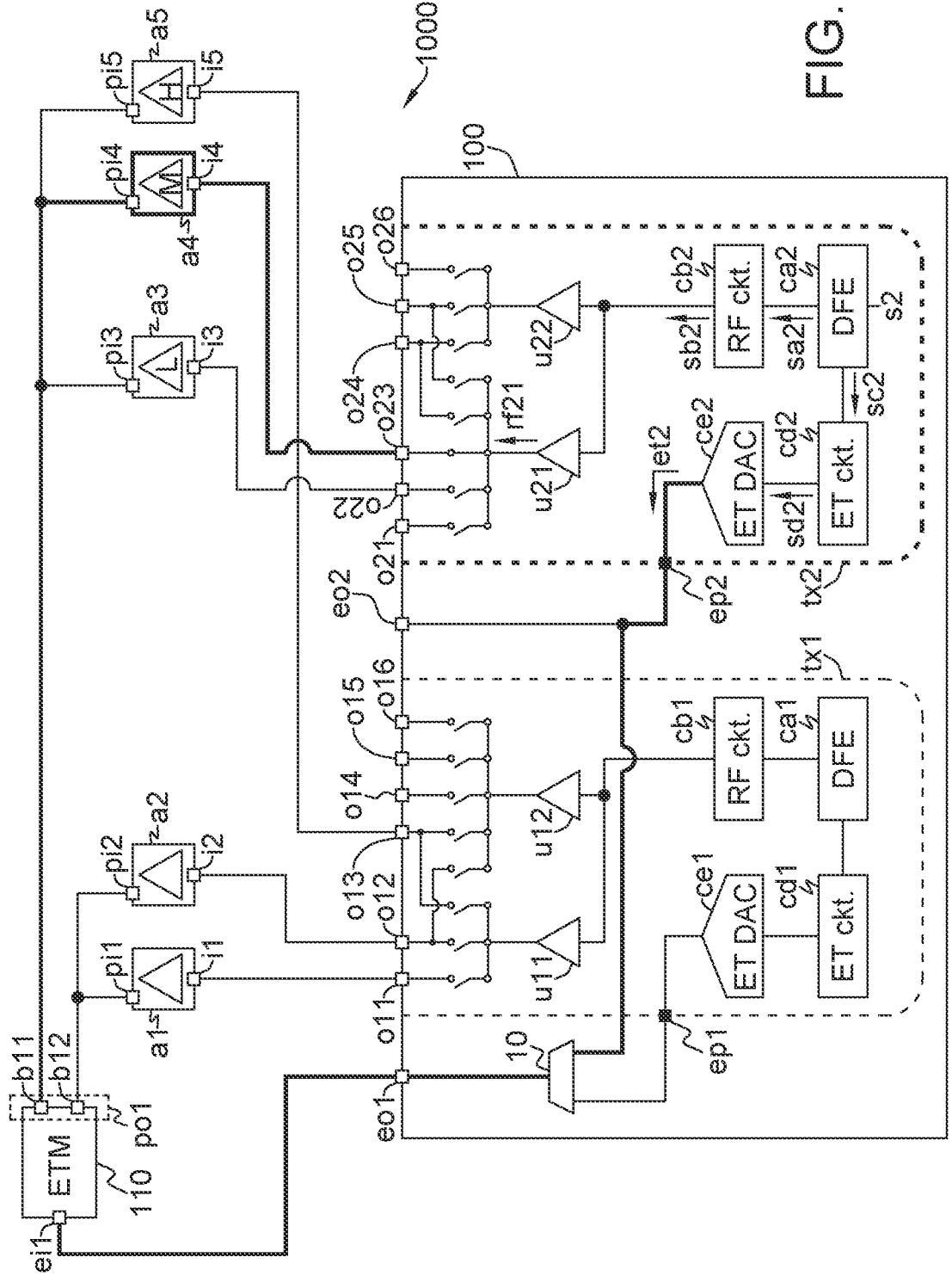

As shown in FIG. 1c, during a second time interval (e.g., a second transmitting mode, transmitting configuration, transmitting scheme or transmitting scenario, etc.), the transmitter tx2 may be enabled, may therefore provide the RF signal rf21 to the RF output o23 to be amplified by the PA a4, and may provide the ET signal et2, which may reflect an envelope of the RF signal rf21, to the ET port ep2; the ET multiplexer 10 may relay the ET port ep2 to the ET output eo1, so the ET signal et2 may reach the ET input ei1 via the ET port ep2, the ET multiplexer 10 and the ET output eo1. Accordingly, the ETM 110 may supply the PA a4 to amplify the RF signal rf21 of the transmitter tx2 with power which may track the envelope of the RF signal rf21. During the second time interval, the transmitter tx1 may be disabled.

According to FIGS. 1b and 1c, it is understood that, by the ET multiplexer 10 according to the invention, two PAs (e.g., a5 and a4) respectively arranged to amplify two RF signals (e.g., rf12 and rf21) of two transmitters (e.g., tx1 and tx2) may be supplied by the same ETM 110. On the other hand, in prior art, two PAs respectively arranged to amplify two RF signals of two transmitters need to be supplied by two ETMs. Hence, it is understood that the RF module 100 with the ET multiplexer 10 according to the invention may effectively improve usage of ET power supply technology and ETM.

Figure 1D:
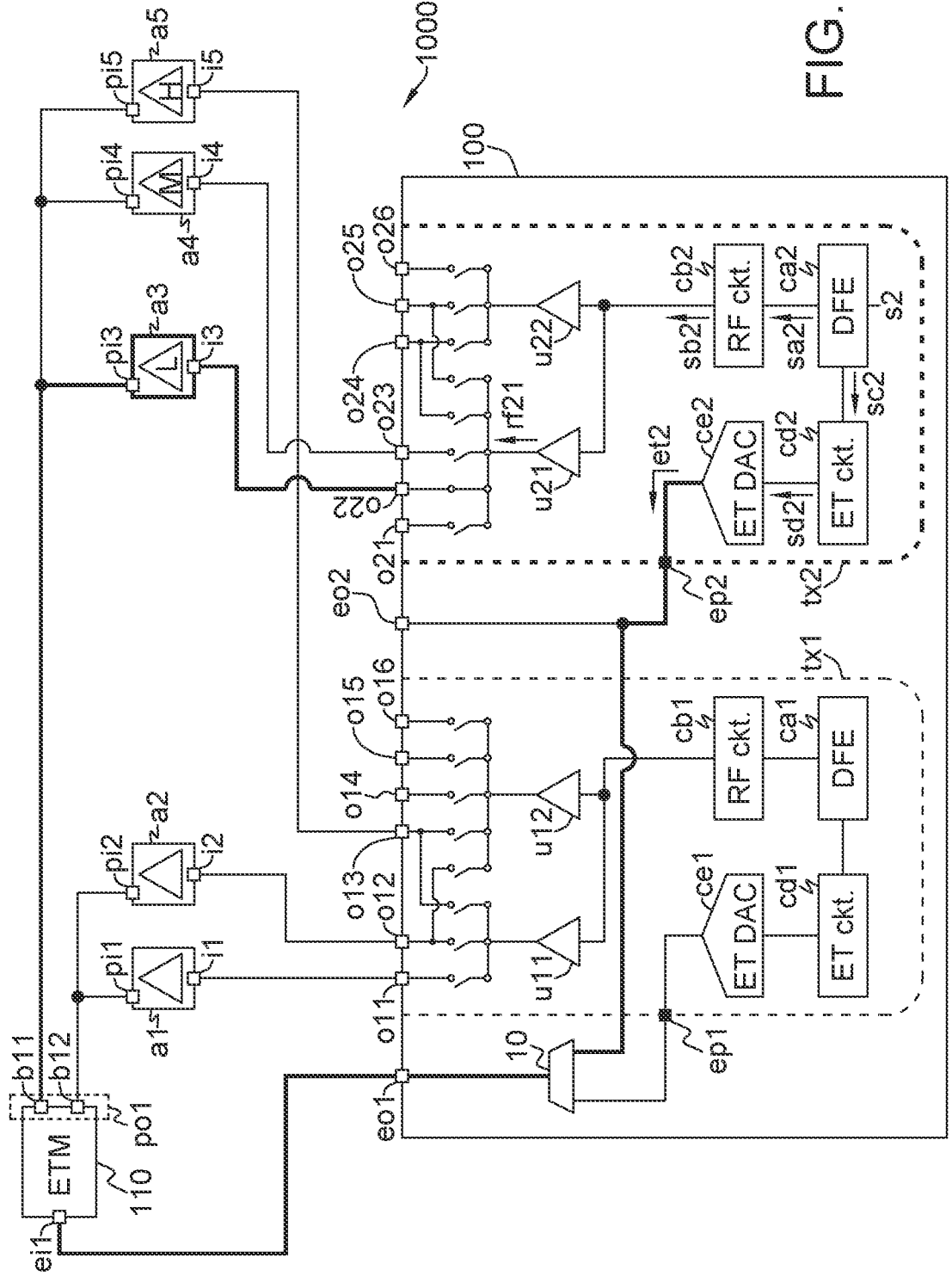

As shown in FIG. 1d, during a third time interval (e.g., a third transmitting mode, transmitting configuration, transmitting scheme or transmitting scenario, etc.), the transmitter tx2 may be enabled, may therefore provide the RF signal rf21 to the RF output o22 to be amplified by the PA a3, and may provide the ET signal et2, which may reflect an envelope of the RF signal rf21, to the ET port ep2; the ET multiplexer 10 may relay the ET port ep2 to the ET output eo1, so the ET signal et2 may reach the ET input ei1 via the ET port ep2, the ET multiplexer 10 and the ET output eo1. Accordingly, the ETM 110 may supply the PA a3 to amplify the RF signal rf21 of the transmitter tx2 with power which may track the envelope of the RF signal rf21. During the third time interval, the transmitter tx1 may be disabled.

Figure 1E:
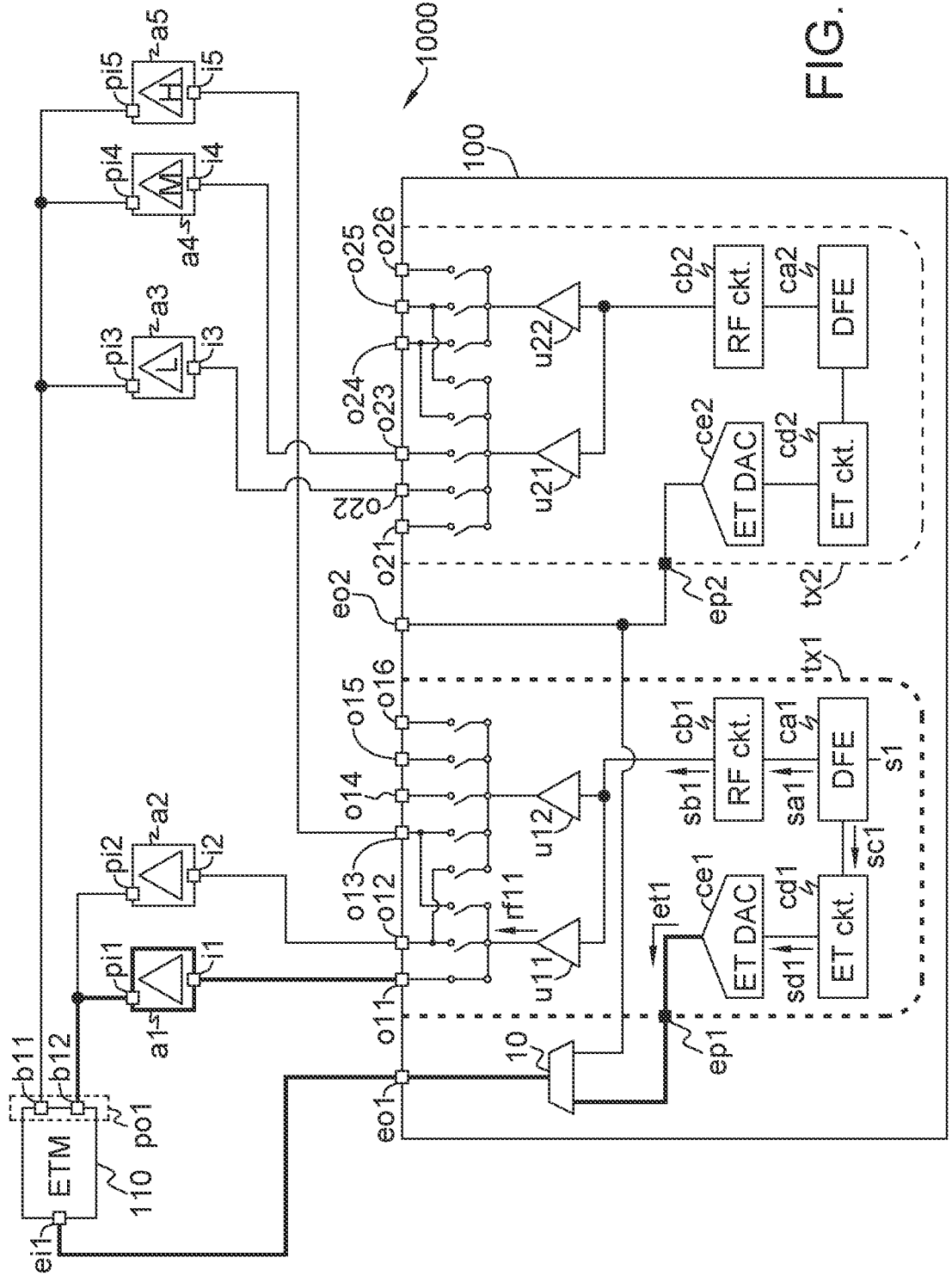

As shown in FIG. 1e, during a fourth time interval (e.g., a fourth transmitting mode, transmitting configuration, transmitting scheme or transmitting scenario, etc.), the transmitter tx1 may be enabled, may therefore provide the RF signal rf11 to the RF output o11 to be amplified by the PA a1, and may provide the ET signal et1, which may reflect an envelope of the RF signal rf11, to the ET port ep1; the ET multiplexer 10 may relay the ET port ep1 to the ET output eo1, so the ET signal et1 may reach the ET input ei1 via the ET port ep1, the ET multiplexer 10 and the ET output eo1. Accordingly, the ETM 110 may supply the PA a1 to amplify the RF signal rf11 of the transmitter tx1 with power which may track the envelope of the RF signal rf11. During the fourth time interval, the transmitter tx2 may be disabled.

Similarly, during a fifth time interval (not illustrated for conciseness), the transmitter tx1 may be enabled, may therefore provide the RF signal rf11 to the RF output o12 to be amplified by the PA a2, and may provide the ET signal et1, which may reflect an envelope of the RF signal rf11, to the ET port ep1; the ET multiplexer 10 may relay the ET port ep1 to the ET output eo1, so the ET signal et1 may reach the ET input ei1 via the ET port ep1, the ET multiplexer 10 and the ET output eo1. Accordingly, the ETM 110 may supply the PA a2 to amplify the RF signal rf11 of the transmitter tx1 with power which may track the envelope of the RF signal rf11. During the fifth time interval, the transmitter tx2 may be disabled.

Figure 2A:
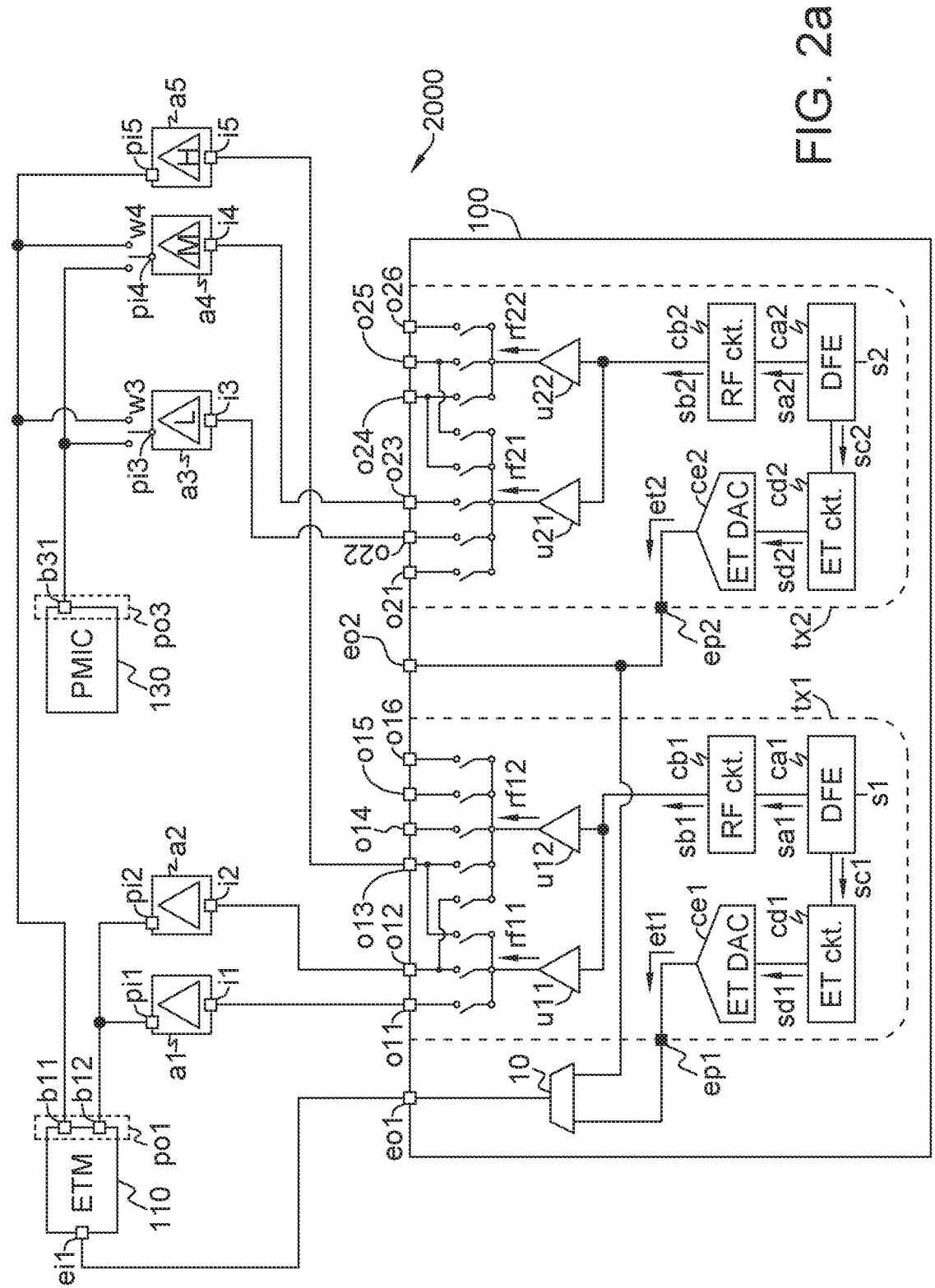
FIG. 2a illustrates a device according to an embodiment of the invention.

FIG. 2a illustrates a device 2000 according to an embodiment of the invention, and FIGS. 2b to 2e illustrate operations of the device 2000 according to embodiments of the invention. Similar to the device 1000 shown in FIG. 1a, the device 2000 in FIG. 2a may comprise the RF module 100, the ETM 110 and the PAs a1 to a5; on the other hand, the device 2000 may further comprise power switches w3 and w4, and a second power source such as a power management integrated circuit (PMIC) 130. The PMIC 130 may supply power based on a power supply technology which does not track instantaneous envelope and therefore does not need ET signal; for example, said power supply technology may be average power tracking (APT) technology, with digital pre-distortion (DPD) if needed. The PMIC 130 may comprise a power output po3, and may supply power to the power output po3. In an embodiment, the power output po3 may comprise a power pin set b31 which may comprise one or more power pins (or solder balls, not shown).

As shown in FIG. 2a, the power inputs pi1 and pi2 of the PAs a1 and a2 may be coupled to the power pin set b12 of the power output po1, and the power input pi5 of the PA a5 may be coupled to the power pin set b11 of the power output po1. The power switch w3 and w4 may be associated with the PAs a3 and a4, respectively. As shown in FIG. 2a, each power switch w #, for #=3 and 4, may be coupled between the power input pi # of the PA a #, the power pin set b31 of the power output po3 and the power pin set b11 of the power output po1, and may selectively relay one of the power outputs po1 and po3 to the power input pi #. In an embodiment, for #=3 or 4, the power switch w # and the associated PA a # may be integrated into a same semiconductor chip (e.g., IC); in another embodiment, the power switch w # and the PA a # may be packaged in two different semiconductor chips, respectively; for example, the power switch s # may be packaged in a standalone semiconductor chip, while the PA a # may be packaged in another semiconductor chip. The RF inputs i1, i2 and i5 of the PAs a1, a2 and a5 may be respectively coupled to the RF outputs o11, o12 and o13 of the transmitter tx1, and the RF inputs i3 and i4 of the PAs a3 and a4 may be respectively coupled to the RF outputs o22 and o23 of the transmitter tx2.

Figure 2B:
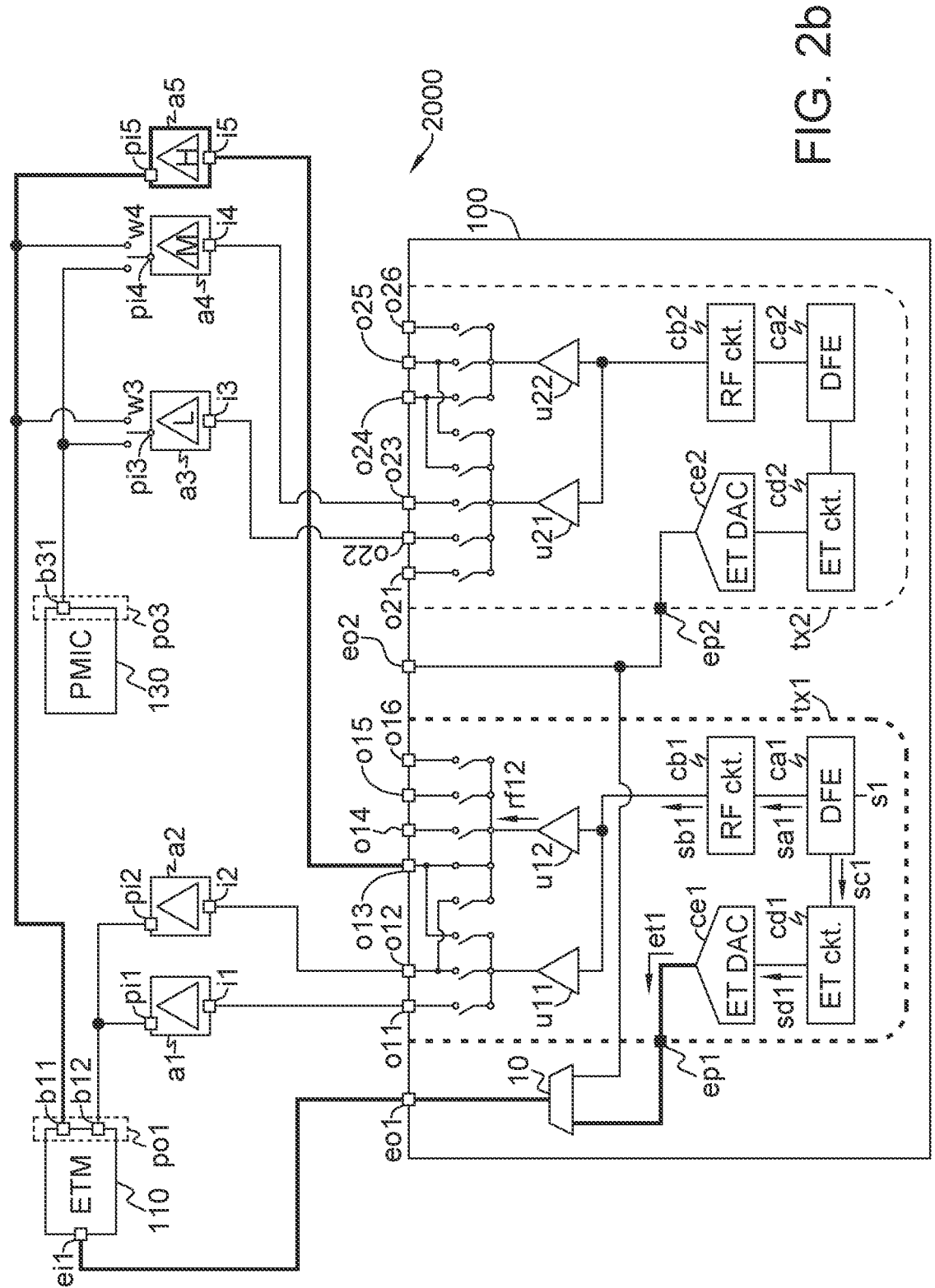
FIGS. 2b to 2e illustrate operations of the device shown in FIG. 2a according to embodiments of the invention.

As shown in FIG. 2b, during a first time interval, the transmitter tx1 may be enabled, may therefore provide the RF signal rf12 to the RF output o13 to be amplified by the PA a5, and may provide the ET signal et1, which may reflect an envelope of the RF signal rf12, to the ET port ep1; the ET multiplexer 10 may relay the ET port ep1 to the ET output eo1, so the ET signal et1 may reach the ET input ei1 of the ETM 110 via the ET port ep1, the ET multiplexer 10 and the ET output eo1. Accordingly, the ETM 110 may supply the PA a5 to amplify the RF signal rf12 of the transmitter tx1 with power which may track the envelope of the RF signal rf12. During the first time interval, the transmitter tx2 may be disabled.

Figure 2C:
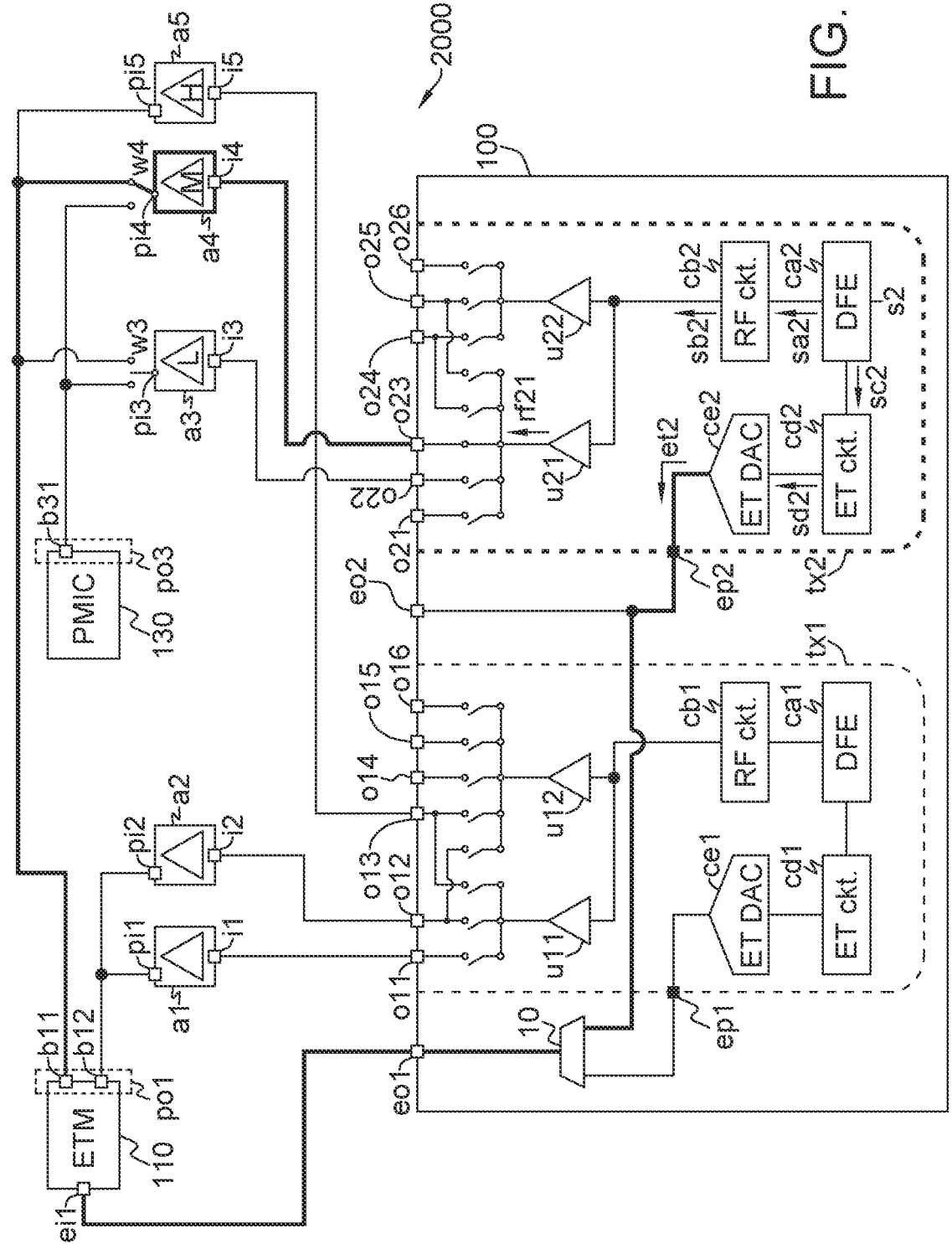

As shown in FIG. 2c, during a second time interval, the transmitter tx2 may be enabled, may therefore provide the RF signal rf21 to the RF output o23 to be amplified by the PA a4, and may provide the ET signal et2, which may reflect an envelope of the RF signal rf21, to the ET port ep2; the ET multiplexer 10 may relay the ET port ep2 to the ET output eo1, so the ET signal et2 may reach the ET input ei1 via the ET port ep2, the ET multiplexer 10 and the ET output eo1.

During the second time interval, the power switch w4 may relay the power output po1 of the ETM 110 to the power input pi4 of the PA a4. Accordingly, the ETM 110 may supply the PA a4 to amplify the RF signal rf21 of the transmitter tx2 with power which may track the envelope of the RF signal rf21. During the second time interval, the transmitter tx1 may be disabled.

Figure 2D:
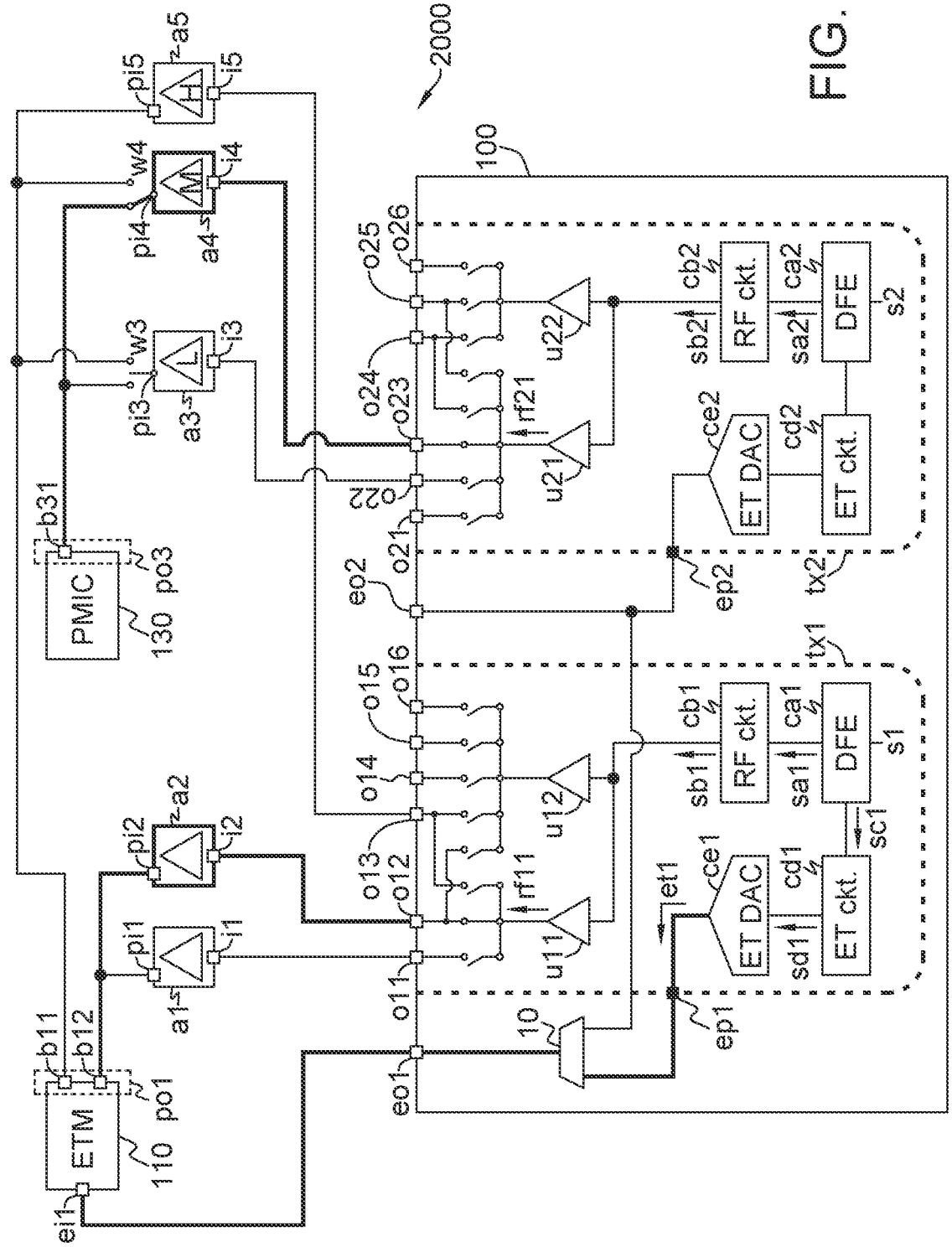

As shown in FIG. 2d, during a third time interval, the transmitter tx1 may be enabled, may therefore provide the RF signal rf11 to the RF output o12 to be amplified by the PA a2, and may provide the ET signal et1, which may reflect an envelope of the RF signal rf11, to the ET port ep1; the ET multiplexer 10 may relay the ET port ep1 to the ET output eo1, so the ET signal et1 may reach the ET input ei1 via the ET port ep1, the ET multiplexer 10 and the ET output eo1. Accordingly, the ETM 110 may supply the PA a2 to amplify the RF signal rf11 of the transmitter tx1 with power which may track the envelope of the RF signal rf11. During the third time interval, the transmitter tx2 may also be enabled, may therefore provide the RF signal rf21 to the RF output o23 to be amplified by the PA a4; the power switch w4 may relay the power output po3 of the PMIC 130 to the power input pi4 of the PA a4. Accordingly, the PMIC 130 may supply the PA a4 to amplify the RF signal rf21 of the transmitter tx2.

Figure 2E:
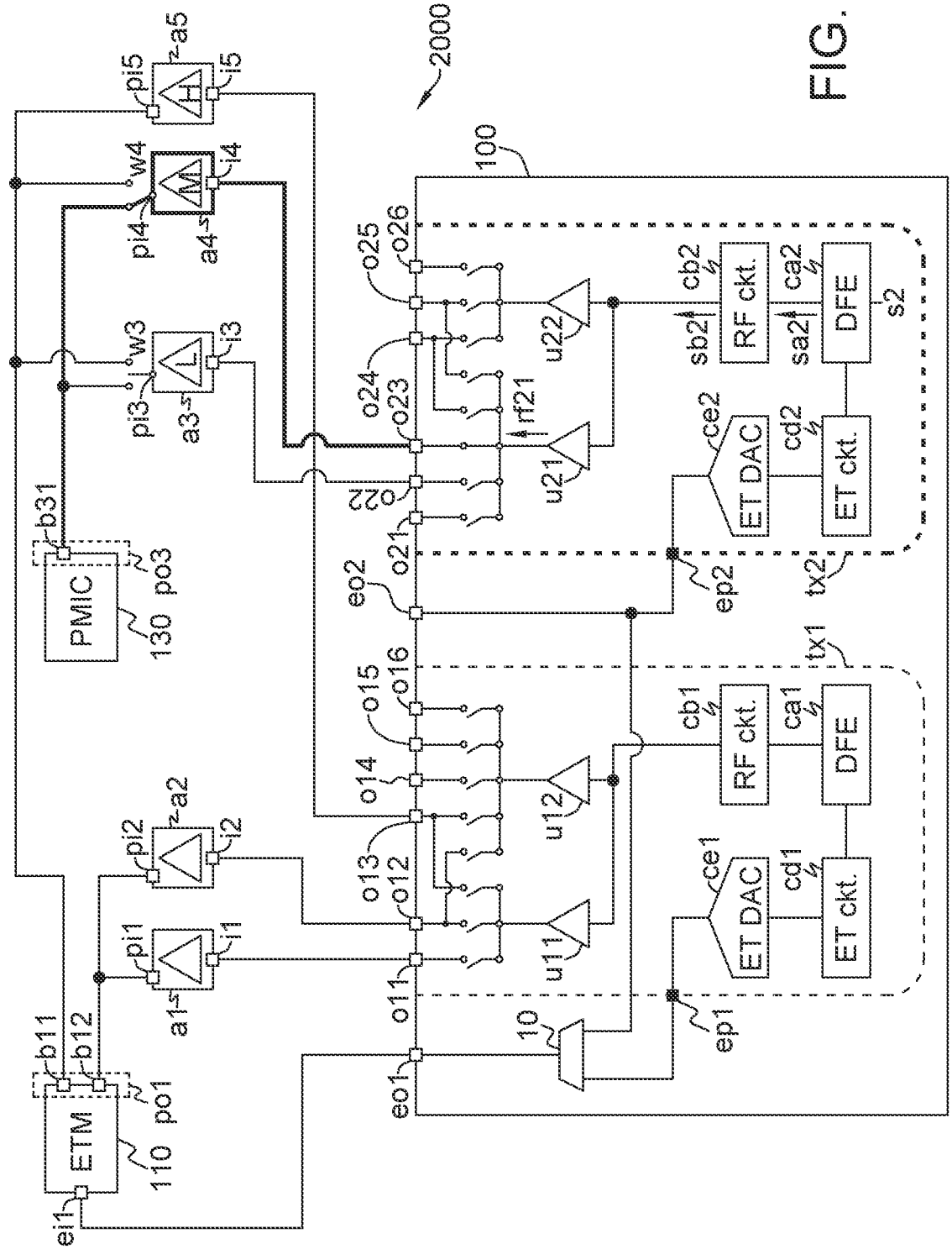

As shown in FIG. 2e, during a fourth time interval, the transmitter tx2 may be enabled and may therefore provide the RF signal rf21 to the RF output o23 to be amplified by the PA a4; the power switch w4 may relay the power output po3 of the ETM 130 to the power input p4 of the PA a4. Accordingly, the PMIC 130 may supply the PA a4 to amplify the RF signal rf21 of the transmitter tx2. During the fourth time interval, the transmitter tx1 may be disabled.

According to FIGS. 2b to 2e, operations of the device 2000 may be briefly described as follows. During a time interval similar to the first interval (FIG. 2b), the transmitters tx1 and tx2 may be enabled and disabled, respectively. The enabled transmitter tx1 may provide an RF signal (rf11 or rf12) to be amplified by a PA (a1, a2 or a5), and may provide an ET signal et1 which may reflect an envelope of the RF signal. The ET multiplexer 10 may route the ET signal et1 to the ETM 110, so the ETM 110 may supply the PA according to the ET signal et1.

During a time interval similar to the second time interval (FIG. 2c), the transmitters tx1 and tx2 may be disabled and enabled, respectively. The enabled transmitter tx2 may provide an RF signal (rf21 or rf22) to be amplified by a PA (a3 or a4), and may provide the ET signal et2 which may reflect an envelope of the RF signal. The ET multiplexer 10 may route the ET signal et2 to the ETM 110, and the power switch (w3 or w4) associated with the PA (a3 or a4) may relay the power output po1 of the ETM 110 to the power input (pi3 or pi4) of the PA, so the ETM 110 may supply the PA according to the ET signal et2.

During a time interval similar to the third interval (FIG. 2d), the transmitters tx1 and tx2 may both be enabled. The enabled transmitter tx1 may provide a first RF signal (rf11 or rf12) to be amplified by a first PA (a1, a2 or a5), and may provide the ET signal et1 which may reflect an envelope of the first RF signal. The ET multiplexer 10 may route the ET signal et1 to the ETM 110, so the ETM 110 may supply the first PA according to the ET signal et1. The enabled transmitter tx2 may provide a second RF signal (rf21 or rf22) to be amplified by a second PA (a3 or a4), the power switch (w3 or w4) associated with the second PA may relay the power output po3 of the PMIC 130 to the power input (pi3 or pi4) of the second PA, so the PMIC 130 may supply the second PA.

During a time interval similar to the fourth time interval (FIG. 2e), the transmitters tx1 and tx2 may be disabled and enabled, respectively. The enabled transmitter tx2 may provide an RF signal (rf21 or rf22) to be amplified by a PA (a3 or a4), the power switch (w3 or w4) associated with the PA may relay the power output po3 of the PMIC 130 to the power input (pi3 or pi4) of the PA, so the PMIC 130 may supply the PA.

Figure 3A:
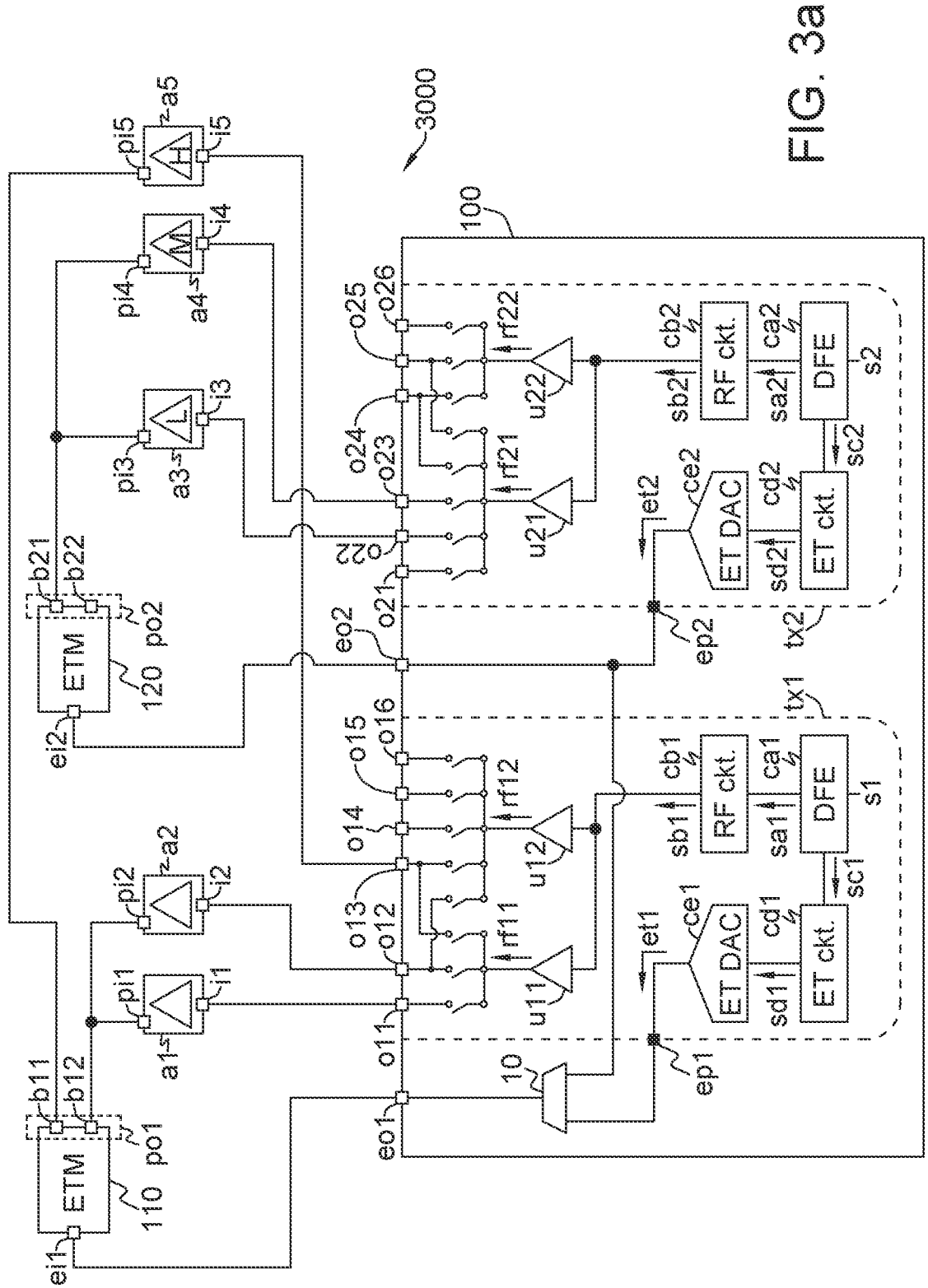
FIG. 3a illustrates a device according to an embodiment of the invention.

FIG. 3a illustrates a device 3000 according to an embodiment of the invention, and FIGS. 3b to 3e illustrate operations of the device 3000 according to embodiments of the invention. Similar to the device 2000 shown in FIG. 2a, the device 3000 in FIG. 3a may comprise the RF module 100, the ETM 110, the PAs a1 to a5, and may further comprise a second ETM 120. The ETM 120 may comprise an ET input ei2 and a power output po2, and may supply power to the power output po2 according to signal obtained from the ET input ei2; the ET input ei2 may be coupled to the ET output eo2 of the RF module 100. As shown in FIG. 3a, in an embodiment, the power output po2 may comprise two power pin sets b21 and b22; each of the pin sets b21 or b22 may comprise one or more pins (solder balls, not shown).

In the device 3000, the power inputs pi1 and pi2 of the PAs a1 and a2 may be coupled to the power pin set b12 of the power output po1, and the power input pi5 of the PA a5 may be coupled to the power pin set b11 of the power output po1. The power inputs pi3 and pi4 of the PAs a3 and a4 may be coupled to the power pin set b21 of the power output po2. The RF inputs i1, i2 and i5 of the PAs a1, a2 and a5 may be respectively coupled to the RF outputs o11, o12 and o13 of the transmitter tx1, and the RF inputs i3 and i4 of the PAs a3 and a4 may be respectively coupled to the RF outputs o22 and o23 of the transmitter tx2.

Figure 3B:
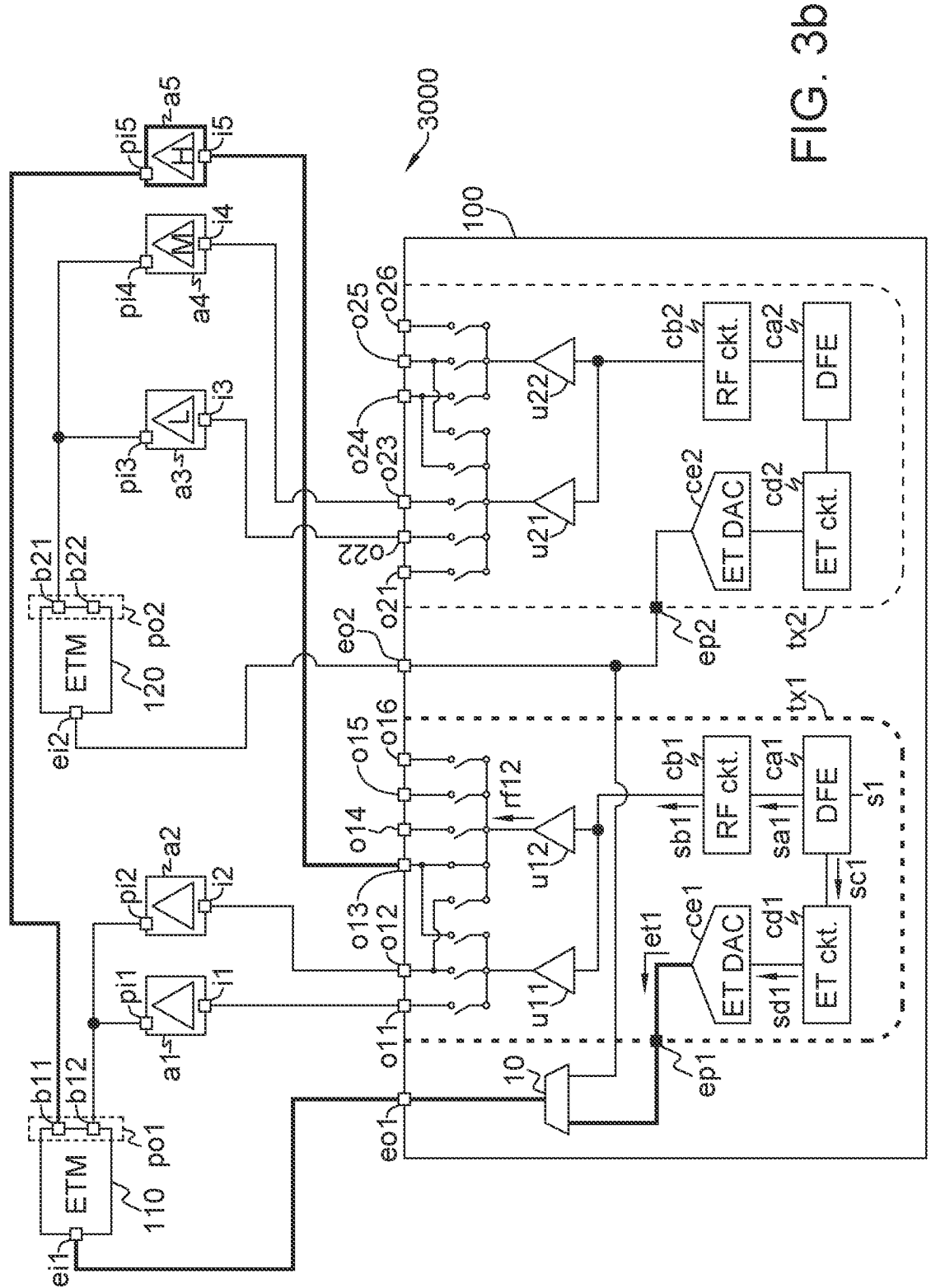
FIGS. 3b to 3e illustrate operations of the device shown in FIG. 3a according to embodiments of the invention.

As shown in FIG. 3b, during a first time interval, the transmitter tx1 may be enabled, may therefore provide the RF signal rf12 to the RF output o13 to be amplified by the PA a5, and may provide the ET signal et1, which may reflect an envelope of the RF signal rf12, to the ET port ep1; the ET multiplexer 10 may relay the ET port ep1 to the ET output eo1, so the ET signal et1 may reach the ET input ei1 via the ET port ep1, the ET multiplexer 10 and the ET output eo1. Accordingly, the ETM 110 may supply the PA a5 to amplify the RF signal rf12 of the transmitter tx1 with power which may track the envelope of the RF signal rf12. During the first time interval, the transmitter tx2 may be disabled.

Figure 3C:
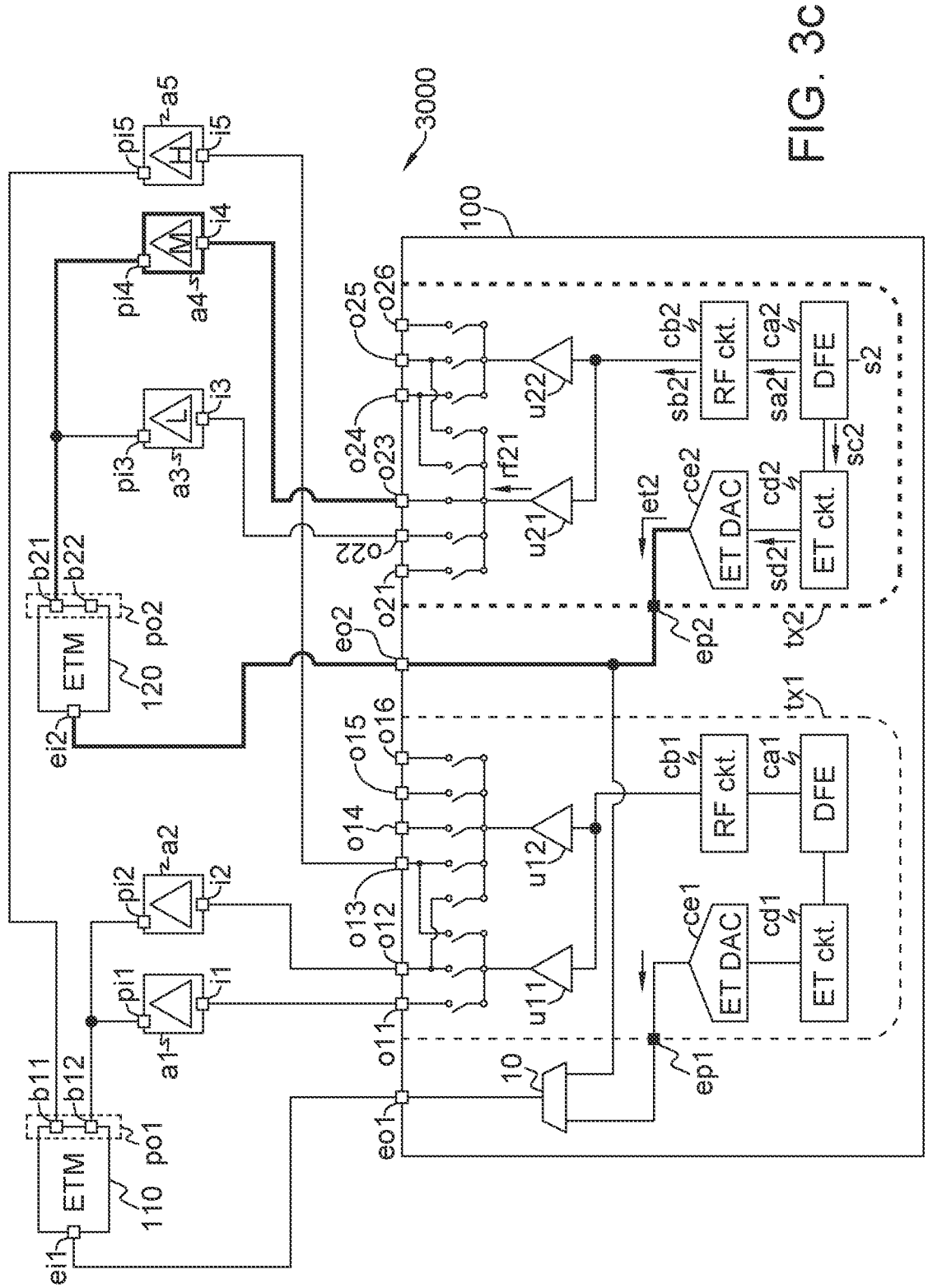

As shown in FIG. 3c, during a second time interval, the transmitter tx2 may be enabled, may therefore provide the RF signal rf21 to the RF output o23 to be amplified by the PA a4, and may provide the ET signal et2, which may reflect an envelope of the RF signal rf21, to the ET port ep2 and the ET output eo2, so the ET signal et2 may reach the ET input ei2 via the ET port ep2 and the ET output eo2. Accordingly, the ETM 120 may supply the PA a4 to amplify the RF signal rf21 of the transmitter tx2 with power which may track the envelope of the RF signal rf21. During the second time interval, the transmitter tx1 may be disabled.

Figure 3D:
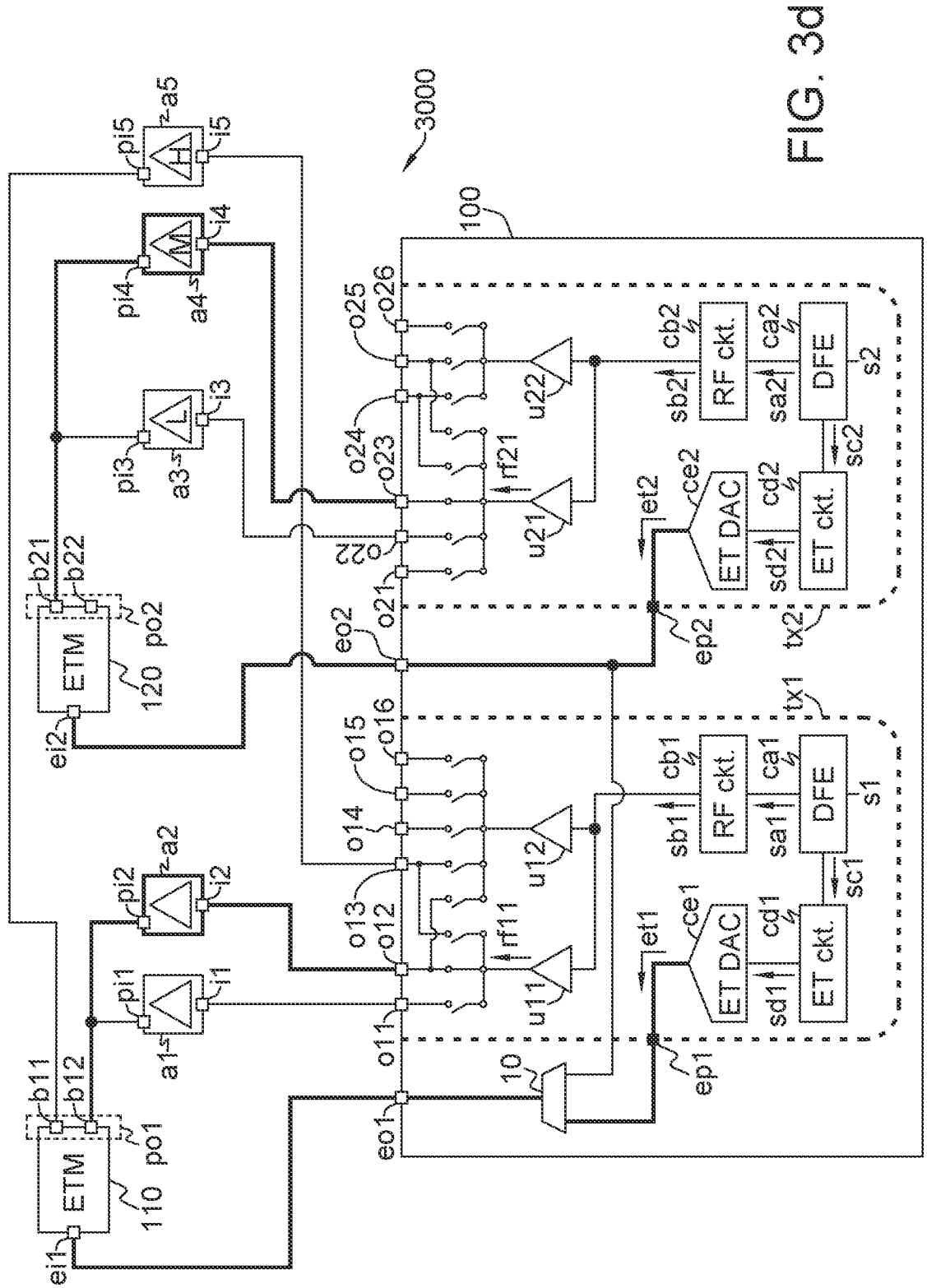

As shown in FIG. 3d, during a third time interval, the transmitter tx1 may be enabled, may therefore provide the RF signal rf11 to the RF output o12 to be amplified by the PA a2, and may also provide the ET signal et1, which may reflect an envelope of the RF signal rf11, to the ET port ep1; the ET multiplexer 10 may relay the ET port ep1 to the ET output eo1, so the ET signal et1 may reach the ET input ei1 of the ETM 110 via the ET port ep1, the ET multiplexer 10 and the ET output eo1. Accordingly, the ETM 110 may supply the PA a2 to amplify the RF signal rf11 of the transmitter tx1 with power which may track the envelope of the RF signal rf11. During the third time interval, the transmitter tx2 may also be enabled, may therefore provide the RF signal rf21 to the RF output o23 to be amplified by the PA a4, and may also provide the ET signal et2, which may reflect an envelope of the RF signal rf21, to the ET port ep2 coupled to the ET output eo2, so the ET signal et2 may propagate to the ET input ei2 of the ETM 120. The power switch w4 may relay the power output po2 of the ETM 120 to the power input pi4 of the PA a4. Accordingly, the ETM 120 may supply the PA a4 to amplify the RF signal rf21 of the transmitter tx2 with power which may track the envelope of the RF signal rf21.

Figure 3E:
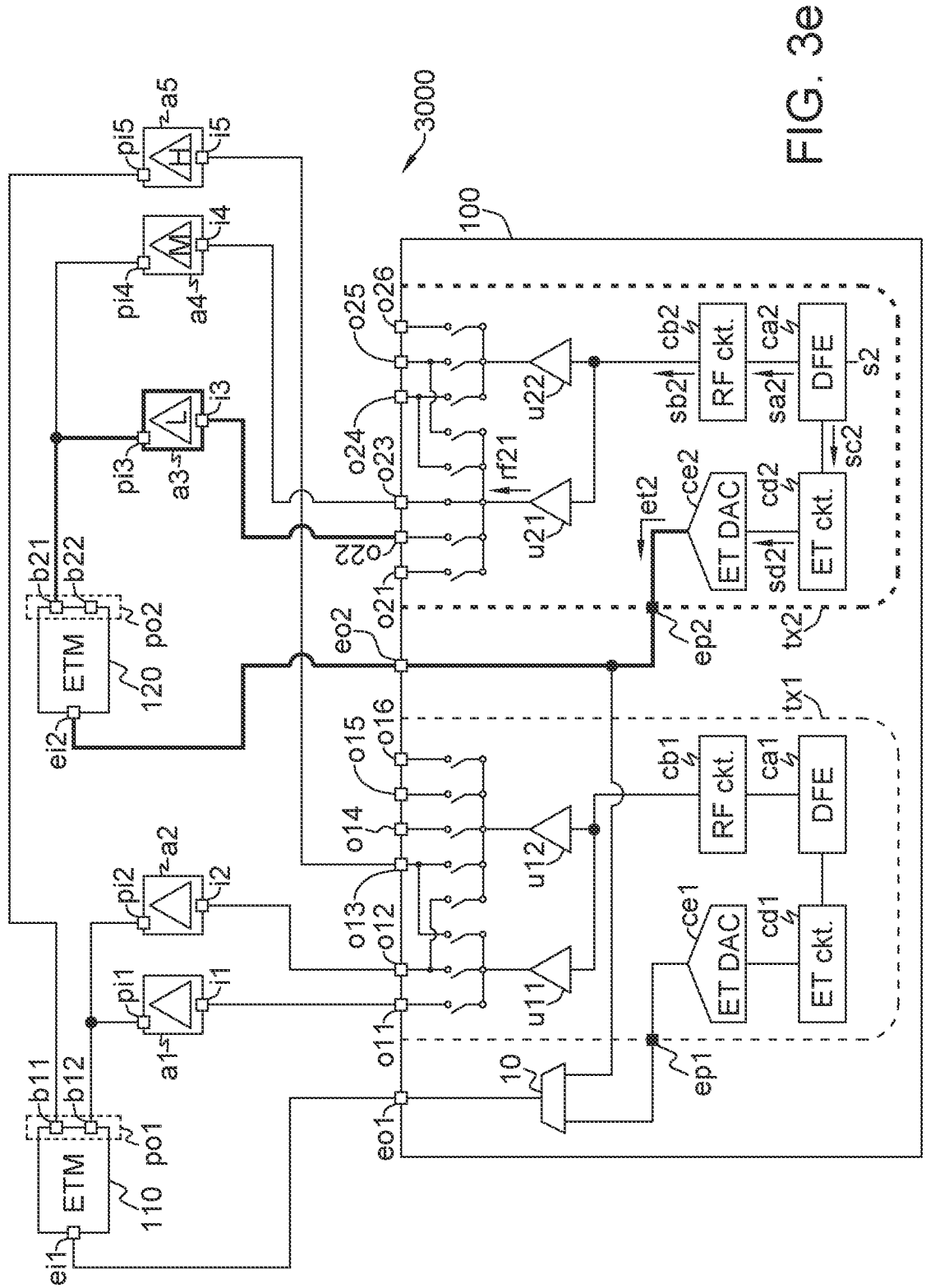

As shown in FIG. 3e, during a fourth time interval, the transmitter tx2 may be enabled, may therefore provide the RF signal rf21 to the RF output o22 to be amplified by the PA a3, and may also provide the ET signal et2, which may reflect an envelope of the RF signal rf21, to the ET port ep2 coupled to the ET output eo2, so the ET signal may reach the ET input ei2 of the ETM 120. Accordingly, the ETM 120 may supply the PA a3 to amplify the RF signal rf21 of the transmitter tx2 with power which may track the envelope of the RF signal rf21.

Figure 4A:
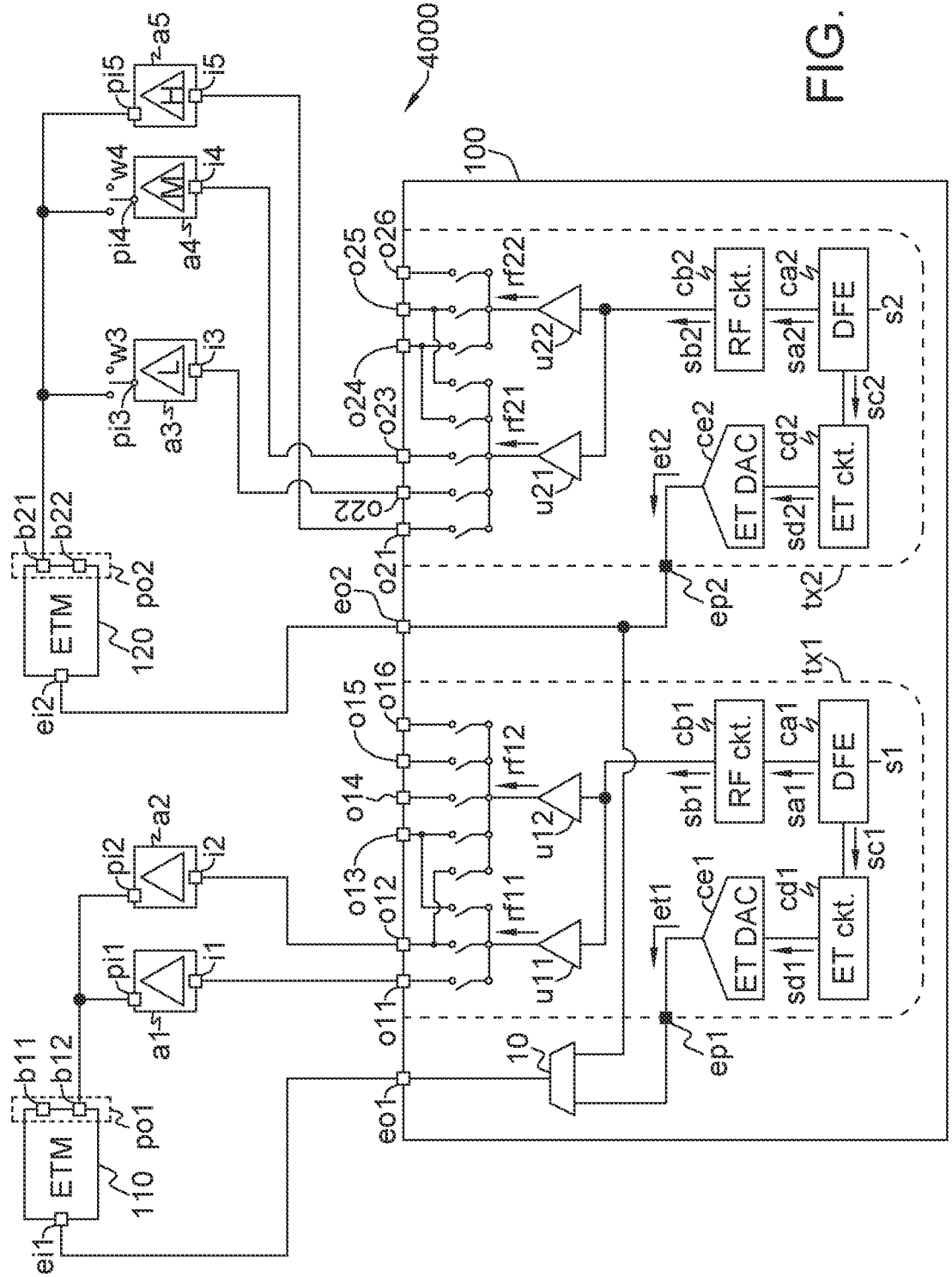
FIG. 4a illustrates a device according to an embodiment of the invention.

FIG. 4a illustrates a device 4000 according to an embodiment of the invention, and FIGS. 4b to 4e illustrate operations of the device 4000 according to embodiments of the invention. Similar to the device 3000 shown in FIG. 3a, the device 4000 in FIG. 4a may comprise the RF module 100, the ETMs 110 and 120, the PAs a1 to a5 and the power switches w3 and w4.

In the device 4000, each power switch w #, for #=3 and 4, may be coupled between the power input pi # of the PA a # and the power pin set b21 of the power output po2, and may relay the power output po2 to the power input pi #. The power inputs pi1 and pi2 of the PAs a1 and a2 may be coupled to the power pin set b12 of the power output po1, and the power input pi5 of the PA a5 may be coupled to the power pin set b21 of the power output po2. The RF inputs i1 and i2 of the PAs a1 and a2 may be respectively coupled to the RF outputs o11 and o12 of the transmitter tx1, and the RF inputs i3, i4 and i5 of the PAs a3, a4 and a5 may be respectively coupled to the RF outputs o22, o23 and o21 of the transmitter tx2.

Figure 4B:
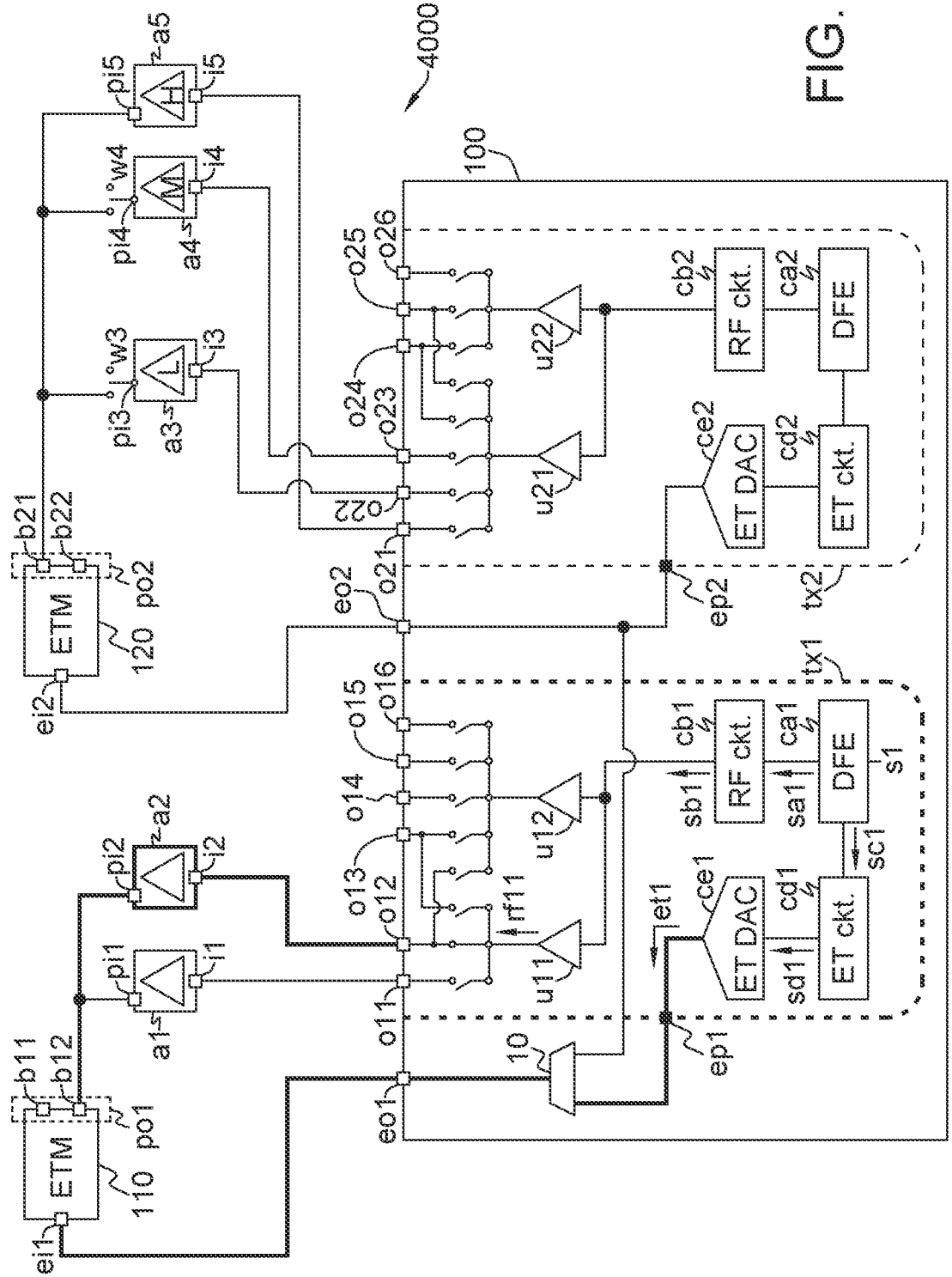
FIGS. 4b to 4e illustrate operations of the device shown in FIG. 4a according to embodiments of the invention.

As shown in FIG. 4b, during a first time interval, the transmitter tx1 may be enabled, and the transmitter tx2 may be disabled. The enabled transmitter tx1 may provide the RF signal rf11 to the RF output o12 to be amplified by the PA a2, and may provide the ET signal et1, which may reflect an envelope of the RF signal rf11, to the ET port ep1; the ET multiplexer 10 may relay the ET port ep1 to the ET output eo1, so the ET signal et1 may reach the ET input ei1 of the ETM 110. Accordingly, the ETM 110 may supply the PA a2 to amplify the RF signal rf11 of the transmitter tx1 with power which may track the envelope of the RF signal rf11.

Figure 4C:
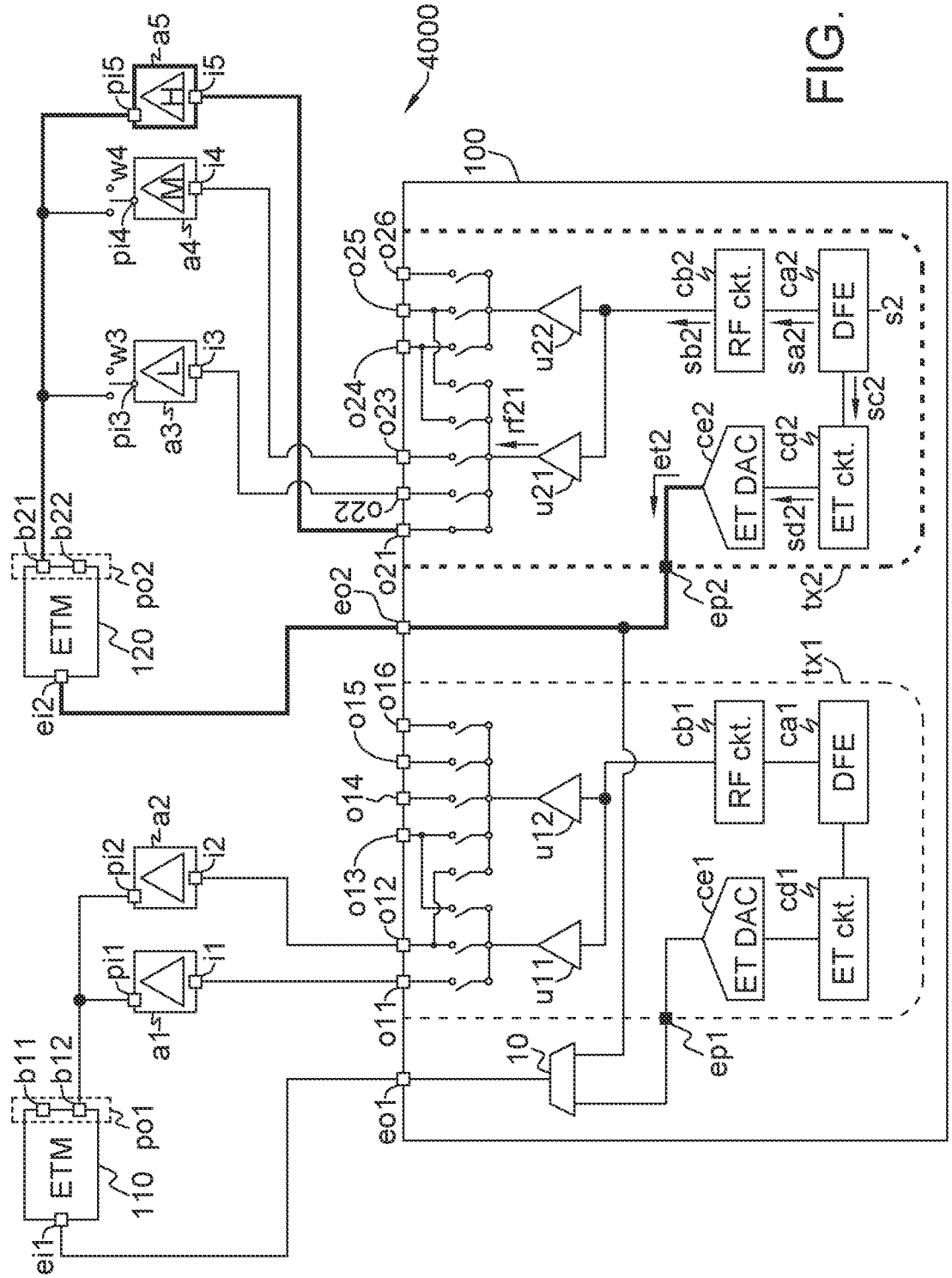

As shown in FIG. 4c, during a second time interval, the transmitter tx1 may be disabled, and the transmitter tx2 may be enabled. The enabled transmitter tx2 may provide the RF signal rf21 to the RF output o21 to be amplified by the PA a5, and may provide the ET signal et2, which may reflect an envelope of the RF signal rf21, to the ET port ep2 coupled to the ET output eo2; the ET signal et2 may therefore reach the ET input ei12 of the ETM 120 via the ET port ep2 and the ET output eo2. Accordingly, the ETM 120 may supply the PA a5 to amplify the RF signal rf21 of the transmitter tx2 with power which may track the envelope of the RF signal rf21.

Figure 4D:
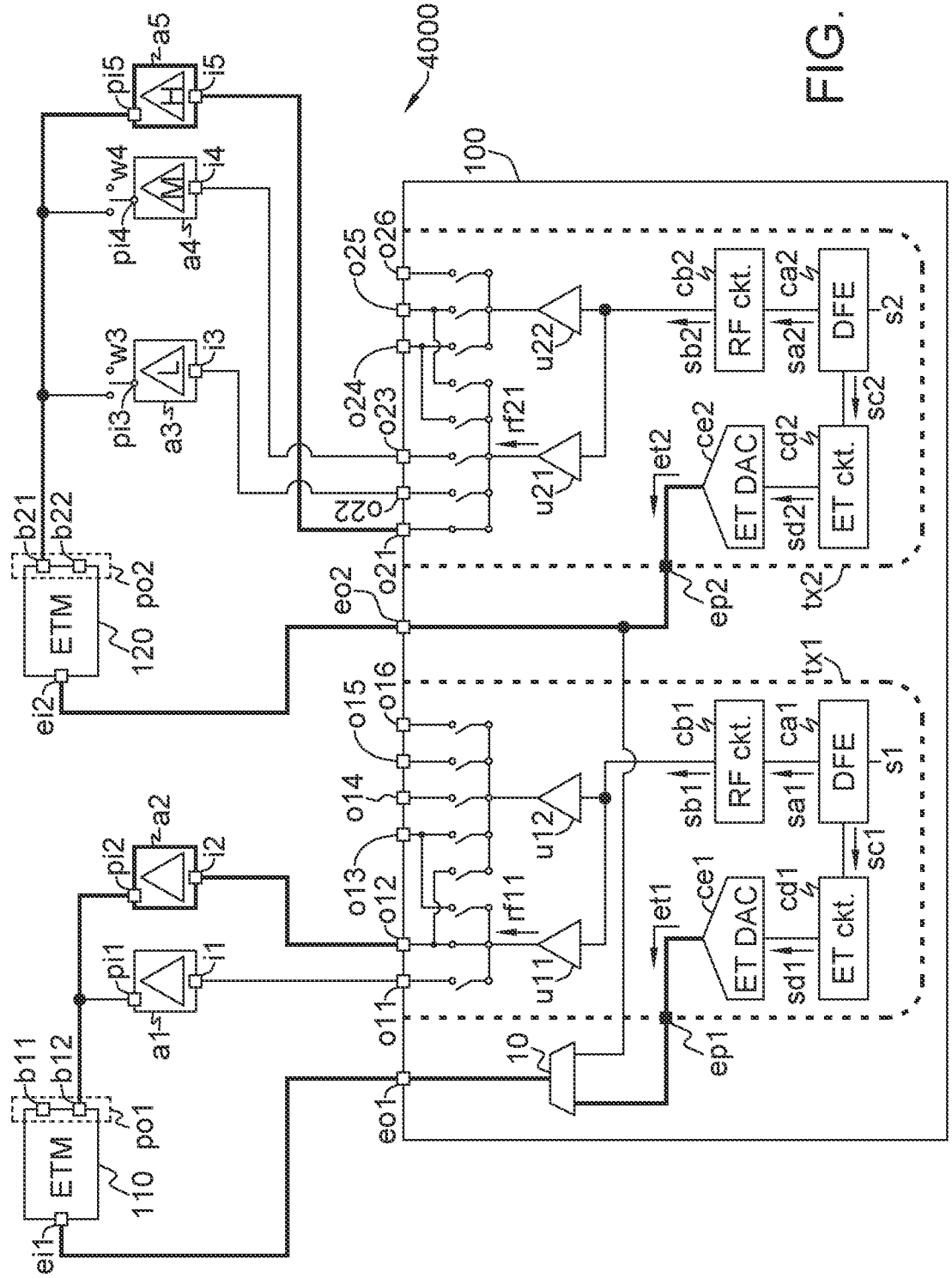

As shown in FIG. 4d, during a third time interval, the transmitters tx1 and tx2 may both be enabled. The enabled transmitter tx1 may provide the RF signal rf11 to the RF output o12 to be amplified by the PA a2, and may provide the ET signal et1, which may reflect an envelope of the RF signal rf11, to the ET port ep1; the ET multiplexer 10 may relay the ET port ep1 to the ET output eo1, so the ET signal et1 may reach the ET input ei1 of the ETM 110 via the ET port ep1, the ET multiplexer 10 and the ET output eo1. Accordingly, the ETM 110 may supply the PA a2 to amplify the RF signal rf11 of the transmitter tx1 with power which may track the envelope of the RF signal rf11. Also during the third time interval, the enabled transmitter tx2 may provide the RF signal rf21 to the RF output o21 to be amplified by the PA a5, and may also provide the ET signal et2, which may reflect an envelope of the RF signal rf21, to the ET port ep2 coupled to the ET output eo2; the ET signal et2 may therefore propagate to the ET input ei2 of the ETM 120 via the ET output eo2. Accordingly, the ETM 120 may supply the PA a5 to amplify the RF signal rf21 of the transmitter tx2 with power which may track the envelope of the RF signal rf21.

Figure 4E:
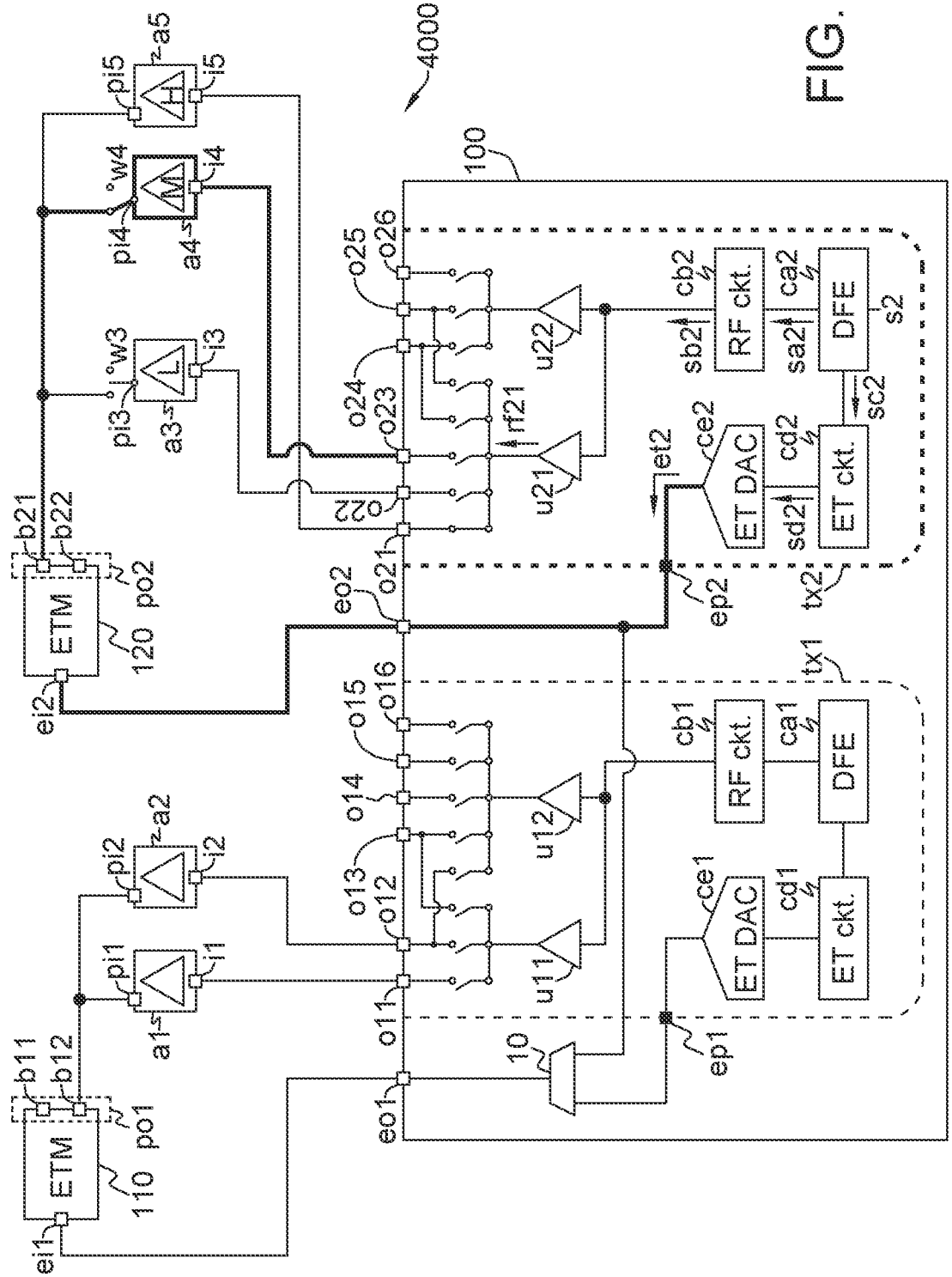

As shown in FIG. 4e, during a fourth time interval, the transmitter tx1 may be disabled, and the transmitter tx2 may be enabled. The enabled transmitter tx2 may provide the RF signal rf21 to the RF output o23 (or o22) to be amplified by the PA a4 (or a3), and may provide the ET signal et2, which may reflect an envelope of the RF signal rf21, to the ET port ep2 coupled to the ET output eo2; the ET signal et2 may therefore reach the ET input ei12 of the ETM 120 via the ET port ep2 and the ET output eo2. The power switch w4 (or w3) may relay the power output po2 of the ETM 20 to the power input pi4 (or pi3) of the PA a4 (or a3). Accordingly, the ETM 110 may supply the PA a4 (or a3) to amplify the RF signal rf21 of the transmitter tx2 with power which may track the envelope of the RF signal rf21.

Figure 5A:
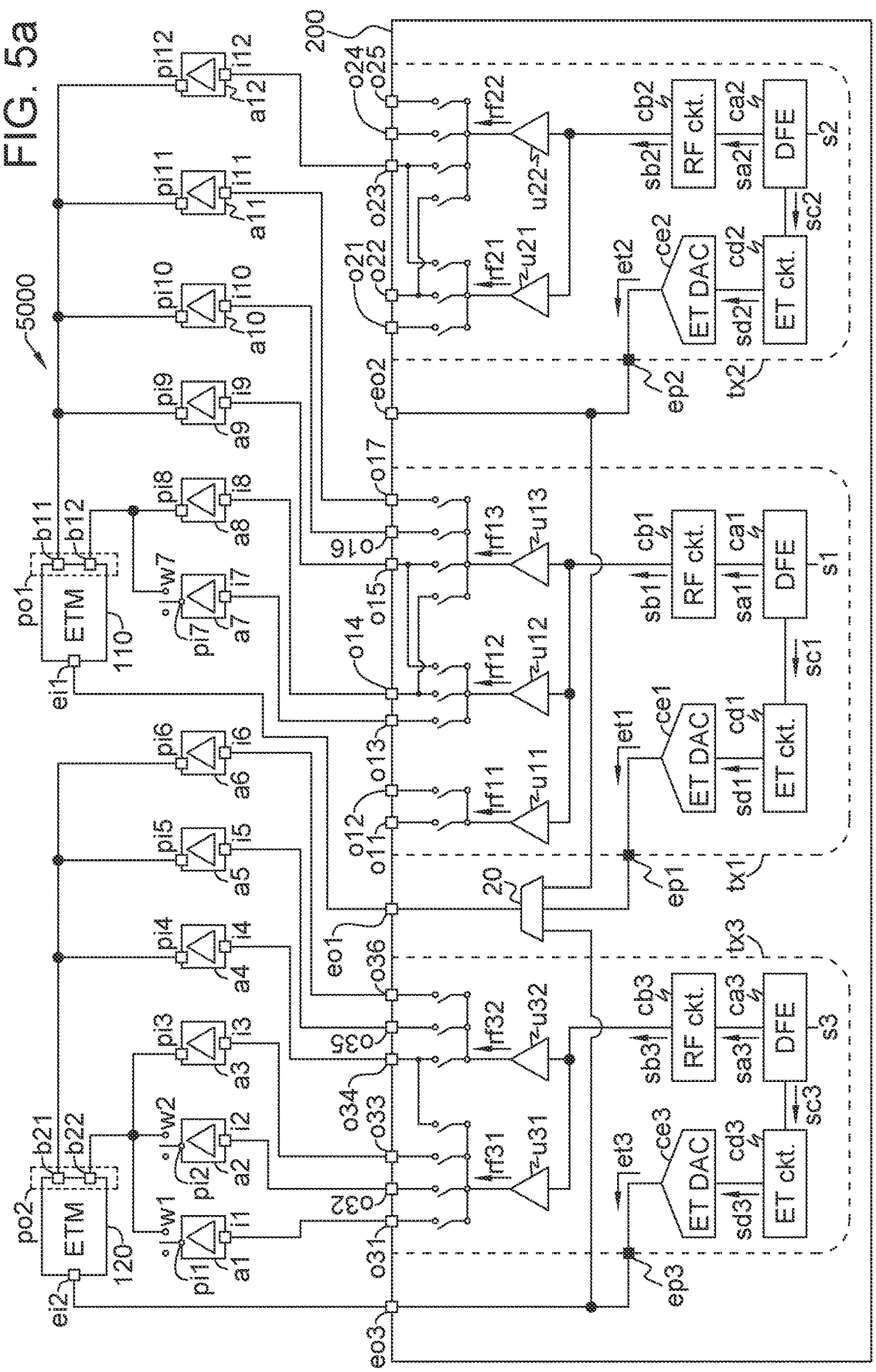
FIG. 5a illustrates a device comprising an RF module according to an embodiment of the invention.

FIG. 5a illustrates a device 5000 comprising an RF module 200 according to an embodiment of the invention. Besides the RF module 200, the device 5000 may further comprise the ETMs 110 and 120, PAs a1 to a12, and power switches w1, w2 and w7.

The RF module 200 may comprise three transmitters tx1, tx2 and tx3, three ET outputs eo1, eo2, and eo3, and an ET multiplexer 20. The RF module 200 may further comprise other circuits, such as receiver(s), etc., which are not illustrated for conciseness.

In the RF module 200, each transmitter tx #, for #=1 to 3, may comprise an ET port ep #, a DFE ca #, an RF circuit cb #, an ET circuit cd # and an ET DAC ce #; the RF circuit cb # may be coupled to the DFE ca #, the ET circuit cd # may be coupled to the DFE ca #, and the ET DAC ce # may be coupled between the ET circuit cd # and the ET port ep #.

The transmitter tx1 may further comprise internal amplifiers u11 to u13, and RF outputs o11 to o17; the internal amplifier u11 may be coupled between the RF circuit cb1 and the RF outputs o11 and o12, the internal amplifier u12 may be coupled between the RF circuit cb1 and the RF outputs o13 to o15, and the internal amplifier u13 may be coupled between the RF circuit cb1 and the RF outputs o14 to o17. The transmitter tx2 may further comprise internal amplifiers u21 and u22, and RF outputs o21 to o25; the internal amplifier u21 may be coupled between the RF circuit cb2 and the RF outputs o21 to o23, and the internal amplifier u22 may be coupled between the RF circuit cb2 and the RF outputs o22 to o25. The transmitter tx3 may further comprise internal amplifiers u31 and u32, and RF outputs o31 to o36; the internal amplifier u31 may be coupled between the RF circuit cb3 and the RF outputs o31 to o34, and the internal amplifier u32 may be coupled between the RF circuit cb3 and the RF outputs o34 to o36. In an embodiment, each of the internal amplifiers u11 to u13, u21, u22, u31 and u32 may be a VGA.

Each transmitter tx #, for #=1 to 3, may be enabled and disabled; when the transmitter tx # is enabled, the DFE ca # may process a content signal s #, which may include contents desired to be transmitted, to form a digital preliminary transmitting signal sa #; and, if necessary, to further form a digital preliminary tracking signal sc # which tracks an envelope of the digital preliminary transmitting signal sa #. In the transmitter tx #, the RF circuit cb # may process the digital preliminary transmitting signal sa # to form an analog intermediate transmitting signal sb #, the ET circuit cd # may process the digital preliminary tracking signal sc # to form a digital intermediate tracking signal sd #, and the ET DAC ce # may convert the digital intermediate tracking signal sd # to an analog ET signal et #. For example, in an embodiment, the DFE ca # may map digital contents in the signal s # to symbols, and may transform the symbols to digital baseband waveform of the signal sa # and, if necessary, to digital baseband waveform of the signal sc #; the RF circuit cb # may upconvert the digital signal sa # to the analog RF signal sb #; the ET circuit cd # may adjust (e.g., scaling, etc.) digital waveform of the signal sc # to form digital waveform of the signal sd #.

Furthermore, when the transmitter tx1 is enabled, the internal amplifier u11 may amplify the analog intermediate transmitting signal sb1 to form an RF signal rf11, the internal amplifier u12 may amplify the analog intermediate transmitting signal sb1 to form an RF signal rf12, or the internal amplifier u13 may amplify the analog intermediate transmitting signal sb1 to form an RF signal rf13. Hence, when the transmitter tx1 is enabled, the transmitter tx1 may provide the RF signal rf11 to one of the RF outputs o11 and o12, the RF signal rf12 to one of the RF outputs o13 to o15, or the RF signal rf13 to one of the RF outputs o14 to o17; if necessary, the transmitter tx1 may also provide the ET signal et1, which may reflect an envelope of the provided RF signal rf11, rf12 or rf13, to the ET port ep1. When the transmitter tx1 is disabled, the transmitter tx1 may not provide the RF signals rf11 to rf13, and may not provide the ET signal et1.

When the transmitter tx2 is enabled, the internal amplifier u21 may amplify the analog intermediate transmitting signal sb2 to form an RF signal rf21, or the internal amplifier u22 may amplify the analog intermediate transmitting signal sb2 to form an RF signal rf22. Hence, when the transmitter tx2 is enabled, the transmitter tx2 may provide the RF signal rf21 to one of the RF outputs o21 to o23, or the RF signal rf22 to one of the RF outputs o22 to o25; if necessary, the transmitter tx2 may also provide the ET signal et2, which reflects an envelope of the provided RF signal rf21 or rf22, to the ET port ep2. When the transmitter tx2 is disabled, the transmitter tx2 may not provide the RF signals rf21 and rf22, and may not provide the ET signal et2.

When the transmitter tx3 is enabled, the internal amplifier u31 may amplify the analog intermediate transmitting signal sb3 to form an RF signal rf31, or the internal amplifier u32 may amplify the analog intermediate transmitting signal sb3 to form an RF signal rf32. Hence, when the transmitter tx3 is enabled, the transmitter tx3 may provide the RF signal rf31 to one of the RF outputs o31 to o34, or the RF signal rf32 to one of the RF outputs o34 to o36; if necessary, the transmitter tx3 may also provide the ET signal et3, which reflects an envelope of the provided RF signal rf31 or rf32, to the ET port ep3. When the transmitter tx3 is disabled, the transmitter tx3 may not provide the RF signals rf31 and rf32, and may not provide the ET signal et3.

In the RF module 200, the ET multiplexer 20 may be coupled between the ET output eo1 and the ET ports ep1 to ep3 of the transmitters tx1 to tx3, and may selectively relay one of the ET ports ep1 to ep3 to the ET output eo1. The ET output eo2 may be coupled to the ET port ep2, and the ET output eo3 may be coupled to the ET port ep3.

In the device 5000, the ET input ei1 of the ETM 110 may be coupled to the ET output eo1, and the ET input ei2 of the ETM 120 may be coupled to the ET output eo3. In the device 5000, each PA a #, for #=1 to 12, may comprise an RF input i # and a power input pi #, and may amplify signal obtained from the RF input i # by consuming power supplied from the power input pi #. As shown in FIG. 5a, the power input pi3 of the PA a3 may be coupled to the power pin set b22 of the power output po2, the power inputs pi4 to pi6 of the PA a4 to a6 may be coupled to the power pin set b21 of the power output po2. The power input pi8 of the PA a8 may be coupled to the power pin set b12 of the power output po1, and the power inputs pi9 to pi12 of the PA a9 to a12 may be coupled to the power pin set b11 of the power output po1. Each power switch w #, for #=1 and 2, may be coupled between the power input pi # of the PA a # and the power pin set b22 of the power output po2, and may relay the power output po2 to the power input pi #. The power switch w7 may be coupled between the power input pi7 of the PA ai7 and the power pin set b12 of the power output po1, and may relay the power output po1 to the power input pi7.

The RF inputs i1 to i6 of the PAs a1 to a6 may be respectively coupled to the RF outputs o31 to o36 of the transmitter tx3, the RF inputs i7 to i11 of the PAs a7 to a11 may be respectively coupled to the RF outputs o13 to o17 of the transmitter tx1, and the RF inputs i12 of the PA a12 may be coupled to the RF output o23 of the transmitter tx2.

Figure 5B:
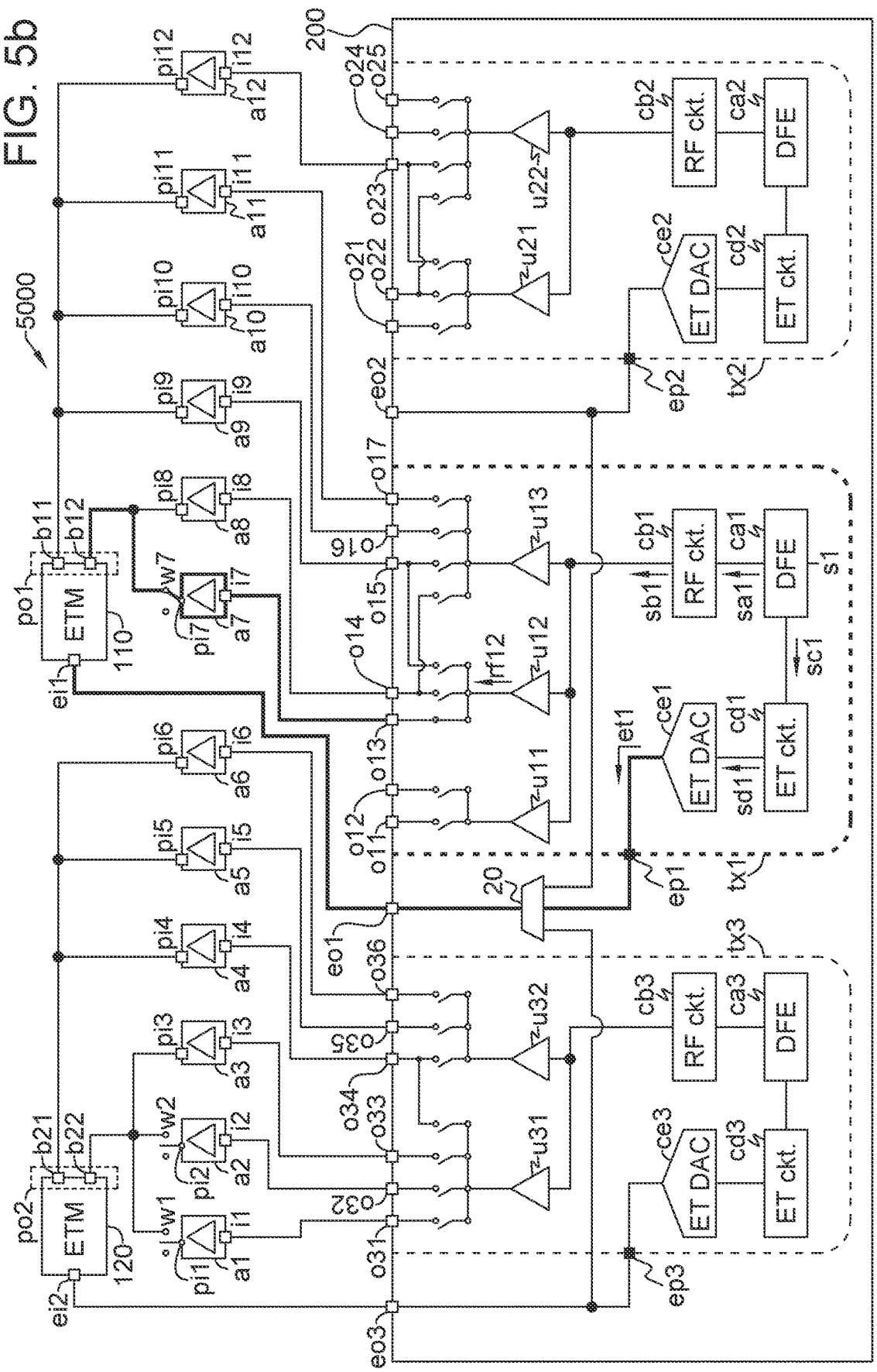
FIGS. 5b to 5f illustrate operations of the device shown in FIG. 5a according to embodiments of the invention.

As shown in FIG. 5b, during a first time interval, the transmitter tx1 may be enabled, and the transmitters tx2 and tx3 may be disabled. The enabled transmitter tx1 may provide the RF signal rf12 to the RF output o13 to be amplified by the PA a7, and may provide the ET signal et1, which may reflect an envelope of the RF signal rf12, to the ET port ep1. The ET multiplexer 20 may relay the ET port ep1 to the ET output eo1, so the ET signal et1 may reach the ET input ei1 of the ETM 110 via the ET port ep1, the ET multiplexer 20 and the ET output eo1. The power switch w7 may relay the power output po1 to the power input pi7 of the PA a7. Accordingly, the ETM 110 may supply the PA a7 to amplify the RF signal rf12 of the transmitter tx1 with power which may track the envelope of the RF signal rf12.

Figure 5C:
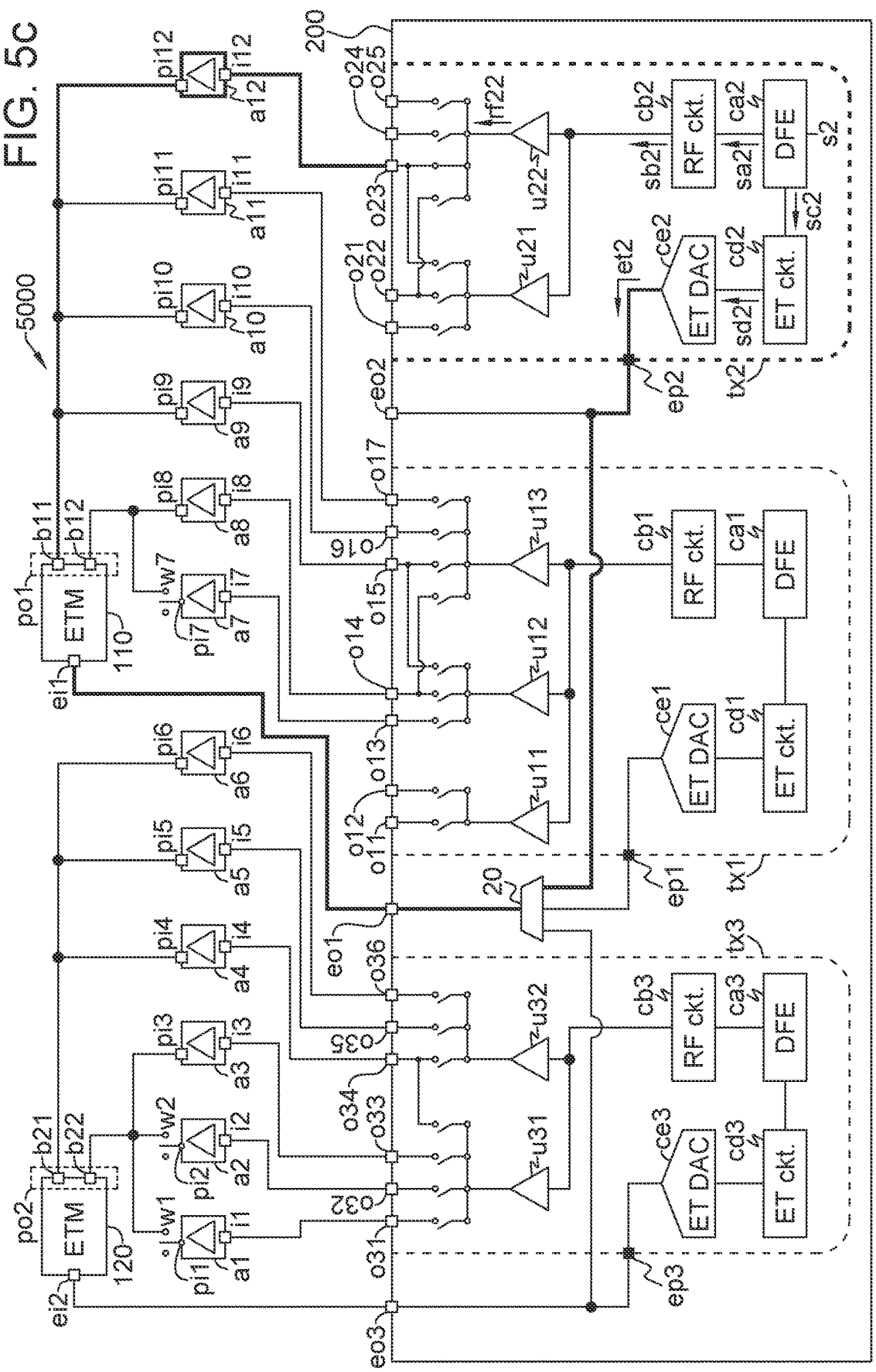

As shown in FIG. 5c, during a second time interval, the transmitter tx2 may be enabled, and the transmitters tx1 and tx3 may be disabled. The enabled transmitter tx2 may provide the RF signal rf22 to the RF output o23 to be amplified by the PA a12, and may provide the ET signal et2, which may reflect an envelope of the RF signal rf22, to the ET port ep2. The ET multiplexer 20 may relay the ET port ep2 to the ET output eo1, and the ET signal et2 may therefore propagate to the ET input ei1 of the ETM 110. Accordingly, the ETM 110 may supply the PA a12 to amplify the RF signal rf22 of the transmitter tx2 with power which may track the envelope of the RF signal rf22.

Figure 5D:
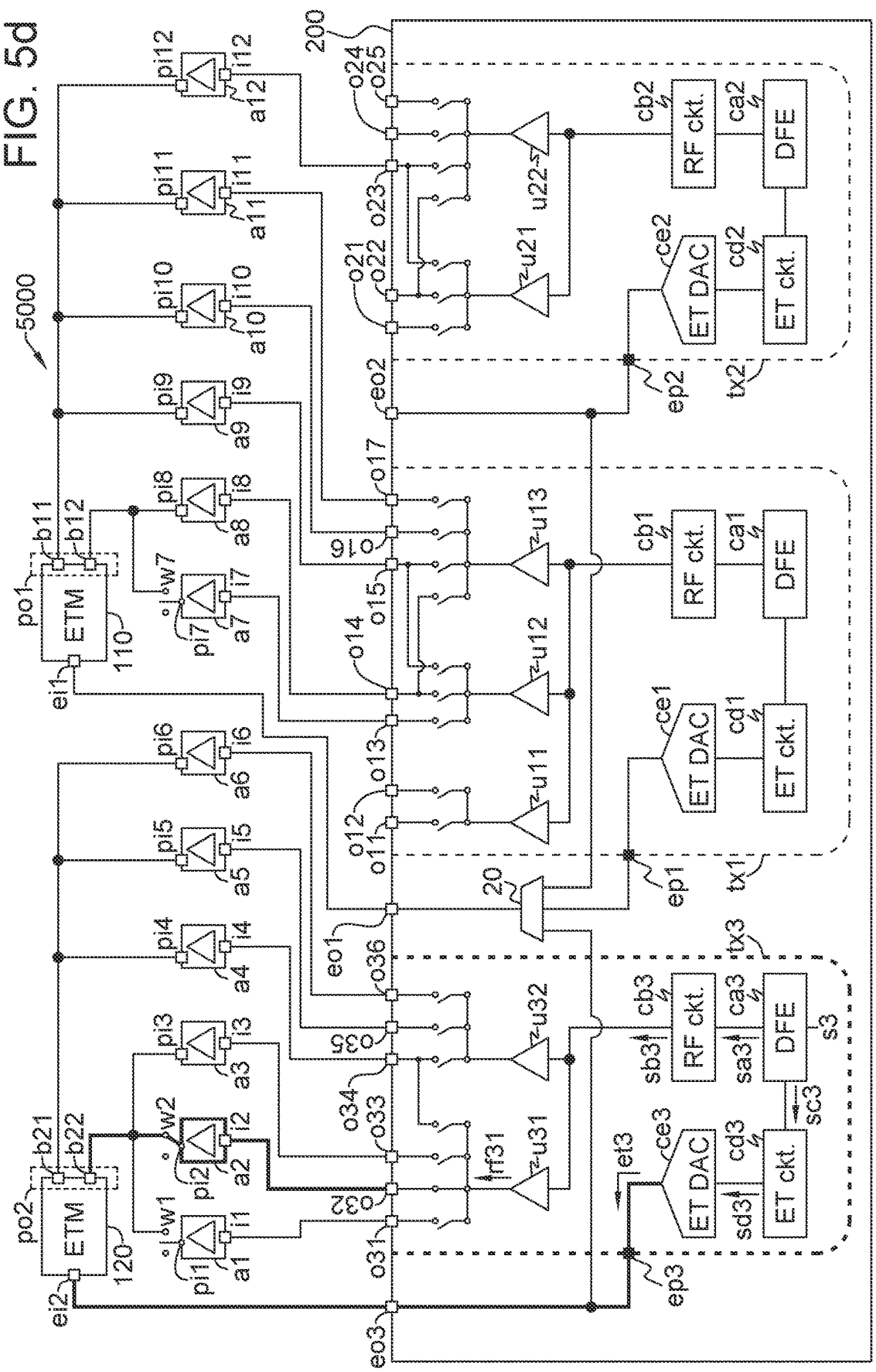

As shown in FIG. 5d, during a third time interval, the transmitter tx3 may be enabled, and the transmitters tx1 and tx2 may be disabled. The enabled transmitter tx3 may provide the RF signal rf31 to the RF output o32 to be amplified by the PA a2, and may provide the ET signal et3, which may reflect an envelope of the RF signal rf31, to the ET port ep3 coupled to the ET output eo3. The ET signal et3 may therefore reach the ET input ei2 of the ETM 120 via the ET port ep3 and the ET output eo3. The power switch w2 may relay the power output po2 of the ETM 120 to the power input pi2 of the PA a2. Accordingly, the ETM 120 may supply the PA a2 to amplify the RF signal rf31 of the transmitter tx3 with power which may track the envelope of the RF signal rf31.

Figure 5E:
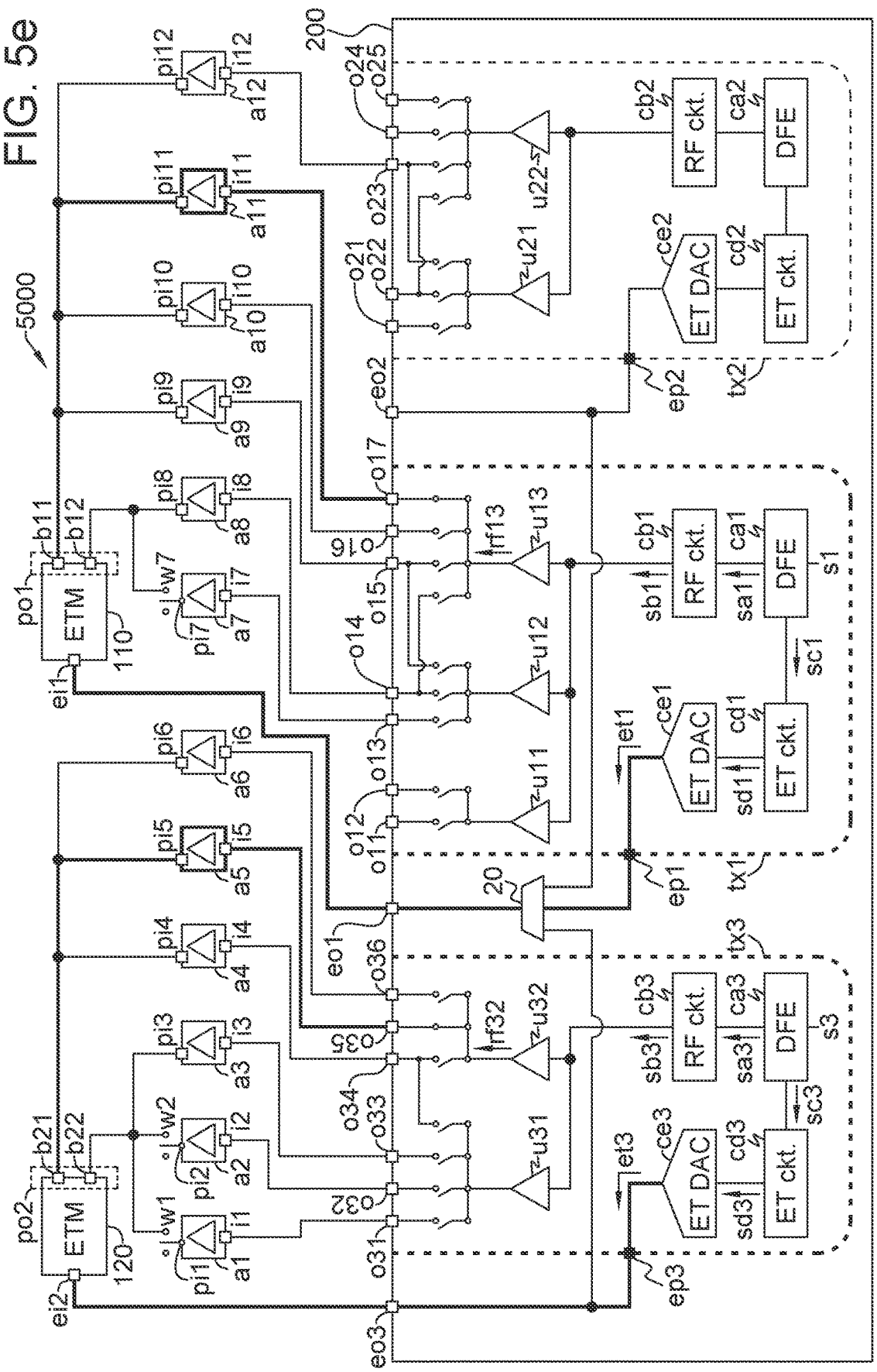

As shown in FIG. 5e, during a fourth time interval, the transmitters tx1 and tx3 may be enabled, and the transmitter tx2 may be disabled. The enabled transmitter tx1 may provide the RF signal rf13 to the RF output o17 to be amplified by the PA a11, and may provide the ET signal et1, which may reflect an envelope of the Rf signal rf13, to the ET port ep1. The ET multiplexer 20 may relay the ET port ep1 to the ET output eo1, so the ET signal et1 may propagate to the ET input ei1 of the ETM 110. Accordingly, the ETM 110 may supply the PA a11 to amplify the RF signal rf13 of the transmitter tx1 with power which may track the envelope of the RF signal rf13. Concurrently, during the fourth time interval, the enabled transmitter tx3 may provide the RF signal rf32 to the RF output o35 to be amplified by the PA a5, and may also provide the ET signal et3, which may reflect an envelope of the RF signal rf32, to the ET port ep3 coupled to the ET output eo3, so the ET signal et3 may propagate to the ET input ei2 of the ETM 120. Accordingly, the ETM 120 may supply the PA a5 to amplify the RF signal rf32 of the transmitter tx3 with power which may track the envelope of the RF signal rf32.

Figure 5F:
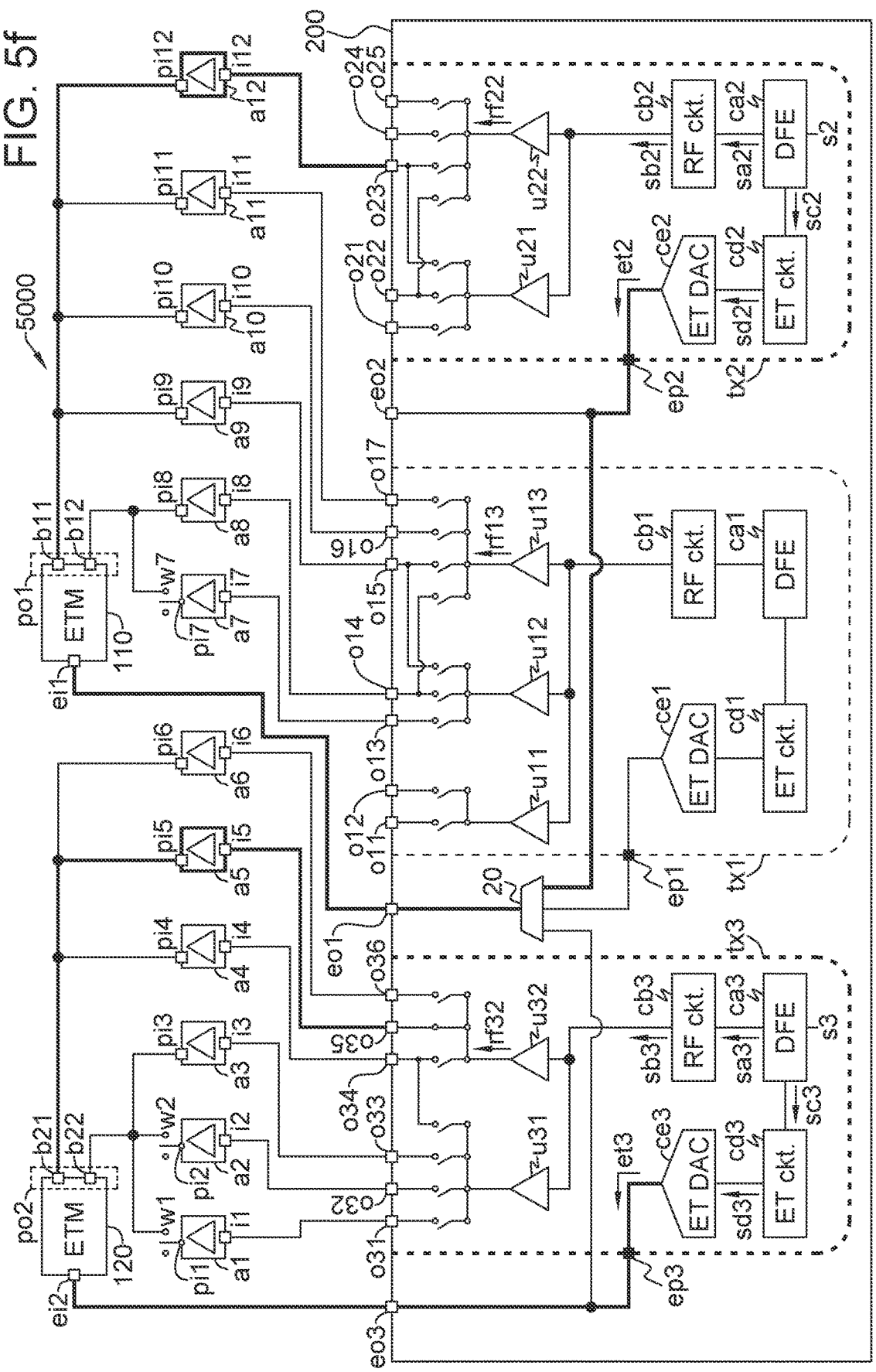

As shown in FIG. 5f, during a fifth time interval, the transmitters tx2 and tx3 may be enabled, and the transmitter tx1 may be disabled. The enabled transmitter tx2 may provide the RF signal rf22 to the RF output o23 to be amplified by the PA a12, and may provide the ET signal et2, which may reflect an envelope of the RF signal rf22, to the ET port ep2. The ET multiplexer 20 may relay the ET port ep2 to the ET output eo1, so the ET signal et2 may reach the ET input ei1 of the ETM 110. Accordingly, the ETM 110 may supply the PA a12 to amplify the RF signal rf22 of the transmitter tx2 with power which may track the envelope of the RF signal rf22. Concurrently, during the fifth time interval, the enabled transmitter tx3 may provide the RF signal rf32 to the RF output o35 to be amplified by the PA a5, and may also provide the ET signal et3, which may reflect an envelope of the RF signal rf32, to the ET port ep3 coupled to the ET output eo3, so the ET signal et3 may propagate to the ET input ei2 of the ETM 120. Accordingly, the ETM 120 may supply the PA a5 to amplify the RF signal rf32 of the transmitter tx3 with power which may track the envelope of the RF signal rf32.

Figure 6:
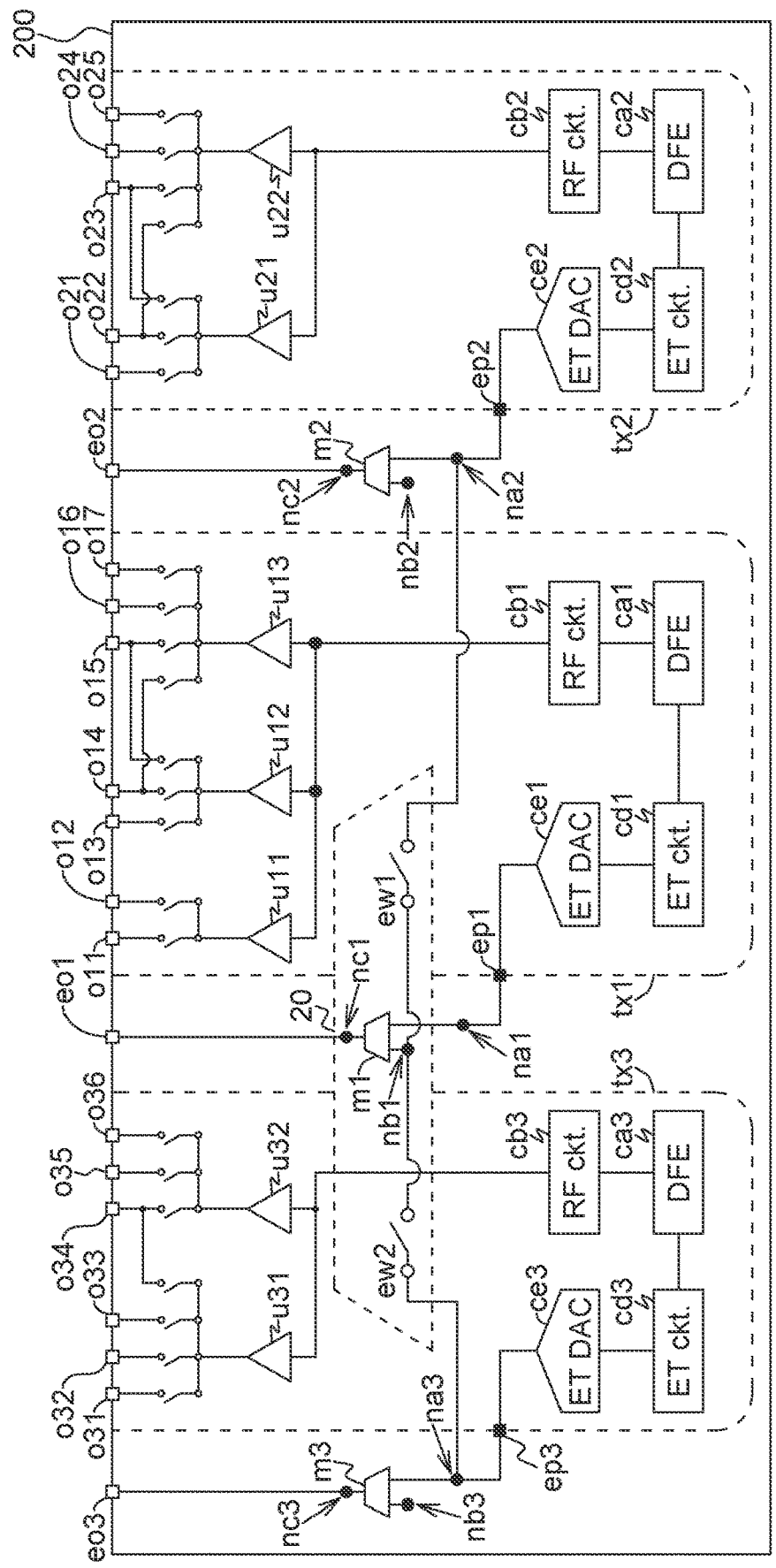

Along with FIG. 5a, FIG. 6 illustrates an implementation of the ET multiplexer 20 according to an embodiment of the invention. As shown in FIG. 6, besides the transmitters tx1 to tx3 and the ET output eo1 to eo3, the RF module 200 may further comprise three multiplexing units m1, m2 and m3 and two ET switches ew1 and ew2. Each multiplexing unit m #, for #=1 to 3, may be a two-to-one multiplexing unit, may comprise two multiplexing input ports na # and nb # and a multiplexing output port nc #, and may selectively relay one of the multiplexing input ports na # and nb # to the multiplexing output port nc #; the multiplexing input port na # may be coupled to the ET port ep #, and the multiplexing output port nc # may be coupled to the ET output eo #.

The ET switch ew1 may be coupled between the multiplexing input port nb1 of the multiplexing unit m1 and the ET port ep2 of the transmitter tx2, may be closed to relay (conduct, electrically connect, etc.) the ET port ep2 to the multiplexing input port nb1, and may be open to stop relaying the ET port ep2 to the multiplexing input port nb1. The ET switch ew2 may be coupled between the multiplexing input port nb1 of the multiplexing unit m1 and the ET port ep3 of the transmitter tx3, may be closed to relay the ET port ep3 to the multiplexing input port nb1, and may be open to stop relaying the ET port ep3 to the multiplexing input port nb1. The ET switches ew1 and ew2 may not be closed concurrently.

The ET multiplexer 20 may be implemented by the multiplexing unit m1 and the two ET switches ew1 and ew2. For example, during the first time interval and the fourth time interval respectively illustrated in FIGS. 5b and 5e, the ET switches ew1 and ew2 may both be open, and the multiplexing unit m1 may relay the multiplexing input port na1 to the multiplexing output port nc1, so the multiplexer 20 may relay the ET port ep1 to the ET output eo1. During the second time interval and the fifth time interval respectively illustrated in FIGS. 5c and 5f, the ET switch ew1 may be closed, the ET switch ew2 may be open, and the multiplexing unit m1 may relay the multiplexing input port nb1 to the multiplexing output port nc1, so the multiplexer 20 may relay the ET port ep2 to the ET output eo1. During the third time interval, the fourth time interval and the fifth time interval respectively illustrated in FIGS. 5d, 5e and 5f, the multiplexing unit m3 may relay the multiplexing input port na3 to the multiplexing output port nc3.

It is noted that FIGS. 1b to 1e, 2b to 2e, 3b to 3e, 4b to 4e or 5b to 5f may not mean to exhaustively list all possible operations of the device 1000, 2000, 3000, 4000 or 5000 respectively shown in FIG. 1a, 2a, 3a, 4a or 5a. In other words, the device 1000, 2000, 3000, 4000 or 5000 in FIG. 1a, 2a, 3a, 4a or 5a may perform operation(s) other than the operations shown in FIGS. 1b to 1e, 2b to 2e, 3b to 3e, 4b to 4e or 5b to 5f. For example, during a time interval not illustrated in FIGS. 5b to 5f, in the device 5000 shown in FIG. 5a, the transmitters tx1 and tx3 may be enabled and the transmitter tx2 may be disabled; the enabled transmitter tx1 may provide the RF signal rf12 to the RF output o14 to be amplified by the PA a8, and may provide the associated ET signal et1 to the ET port ep1; the enabled transmitter tx3 may provide the RF signal rf32 to the RF output o36 to be amplified by the PA a6, and may provide the associated ET signal et2 to the ET port ep3 coupled to the ET output eo3; the ET multiplexer 20 may relay the ET port ep1 to the ET output eo1; accordingly, the ETMs 110 and 120 may respectively supply the PAs a8 and a6.

It is also noted that the device 1000, 2000, 3000, 4000 or 5000 respectively shown in FIG. 1a, 2a, 3a, 4a or 5a may not have to adopt all operations shown in FIGS. 1b to 1e, 2b to 2e, 3b to 3e, 4b to 4e or 5b to 5f.

To sum up, the invention may embed the ET multiplexer into the RF module, so different PAs for amplifying RF signals of different transmitters may share one ETM for power supply. For example, as shown in FIGS. 1b and 1c, the PAs a5 and a4 respectively amplifying the RF signals of the transmitters tx1 and tx2 during different time intervals may be supplied by the same ETM 110; similarly, as shown in FIGS. 5b and 5c, the PAs a7 and a12 respectively amplifying the RF signals of the transmitters tx1 and tx2 during different time intervals may be supplied by the same ETM 110. It is therefore understood that the invention may effectively improve usage of ETM and ET power supply technology, may therefore simplify bill of materials (BOM) and routings of PCB, may increase design flexibility regarding combinations of ETM(s), PAs and transmitters, and may reduce overall cost of implementing wireless functionality.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A radio frequency (RF) module with envelope tracking (ET) power supply in a device, the RF module comprising:
   a plurality of transmitters;
   an ET output; and
   an ET multiplexer; wherein:
   each of the plurality of transmitters comprises an RF output and an ET port, is configured for providing an RF signal to the RF output, and is further configured for providing an ET signal, which reflects an envelope of the RF signal, to the ET port; and
   the ET multiplexer is coupled between said ET ports of the plurality of transmitters and the ET output, for selectively relaying one of said ET ports to the ET output.

2. The RF module of claim 1, wherein the ET multiplexer relays different ones of said ET ports to the ET output during different time intervals.

3. The RF module of claim 1 further comprising one or more additional ET outputs, wherein each said additional ET output is coupled to one of said ET ports.

4. The RF module of claim 1, wherein:
   the plurality of transmitters includes a first transmitter which comprises a first ET port and a first RF output;
   the device further comprises an ET module (ETM) and a first power amplifier (PA) besides the RF module;
   the ETM comprises an ET input and a first power output, and supplies power to the first power output according to signal obtained from the ET input, and the ET input is coupled to the ET output;
   the first PA comprises a first RF input and a first power input respectively coupled to the first RF output and the first power output, and amplifies signal obtained from the first RF input by consuming power supplied from the first power input; and
   during a first time interval, the first transmitter provides a first RF signal to the first RF output, and provides a first ET signal, which reflects an envelope of the first RF signal, to the first ET port; and the ET multiplexer relays the first ET port to the ET output.

5. The RF module of claim 4, wherein:
   the plurality of transmitters further includes a second transmitter which comprises a second ET port and a second RF output;
   the device further comprises a second PA besides the RF module;
   the second PA comprises a second RF input and a second power input, and amplifies signal obtained from the second RF input by consuming power supplied from the second power input;
   the second RF input is coupled to the second RF output; and
   during a second time interval, the second transmitter provides a second RF signal to the second RF output.

6. The RF module of claim 5, wherein:
   the plurality of transmitters further includes a third transmitter which comprises a third ET port and a third RF output; and
   the ET multiplexer is coupled between the first ET port, the second ET port and the third ET port and the ET output, for selectively relaying one of the first ET port, the second ET port and the third ET port to the ET output.

7. The RF module of claim 6, wherein the ET multiplexer comprises:
   a first ET switch and a second ET switch; and
   a two-to-one multiplexing unit comprising a first multiplexing input port, a second multiplexing input port and a multiplexing output port, and selectively relaying one of the first multiplexing input port and the second multiplexing input port to the multiplexing output port; wherein:
   the multiplexing output port is coupled to the ET output;
   the first multiplexing input port is coupled to the first ET port;
   the first ET switch is coupled between the second ET port and the second multiplexing input port;
   the second ET switch is coupled between the third ET port and the second multiplexing input port; and
   the first ET switch and the second ET switch are not closed concurrently.

8. The RF module of claim 5, wherein:
   the second power input is coupled to the first power output;
   during the first time interval, the second transmitter is disabled; and
   during the second time interval, the first transmitter is disabled; the second transmitter further provides a second ET signal, which reflects an envelope of the second RF signal, to the second ET port; and the ET multiplexer relays the second ET port to the ET output.

9. The RF module of claim 5, wherein:
   during the first time interval, the second transmitter provides the second RF signal to the second RF output.

10. The RF module of claim 9, wherein:
    the device further comprises a second power source besides the RF module;
    the second power source comprises a second power output, and supplies power to the second power output; and
    the second power output is coupled to the second power input.

11. The RF module of claim 10, wherein the second power source is a power management integrated circuit (PMIC).

12. The RF module of claim 10, wherein:
    the RF module further comprises a second ET output coupled to the second ET port;
    the second power source is a second ETM which further comprises a second ET input coupled to the second ET output, and supplies power to the second power output according to signal obtained from the second ET input; and
    during the first time interval, the second transmitter further provides a second ET signal, which reflects the envelope of the second RF signal, to the second ET port.

13. The RF module of claim 10, wherein:
    the device further comprises a power switch besides the RF module;
    the power switch is coupled between the first power output, the second power output and the second power input, and selectively relays one of the first power output and the second power output to the second power input;

during the first time interval, the power switch relays the second power output to the second power input; and during the second time interval, the power switch relays the first power output to the second power input, and the ET multiplexer relays the second ET port to the ET output.

14. The RF module of claim 1, wherein each said transmitter further comprises:

a digital frontend (DFE) for processing a content signal to form a preliminary transmitting signal and a preliminary tracking signal which tracks an envelope of the preliminary transmitting signal;

an RF circuit coupled to the DFE, for processing the preliminary transmitting signal to form an intermediate transmitting signal;

an internal amplifier coupled to the RF circuit for amplifying the intermediate transmitting signal to form the RF signal;

an ET circuit coupled to the DFE, for processing the preliminary tracking signal to form an intermediate tracking signal; and an ET digital-to-analog converter (ET DAC) coupled between the ET circuit and the ET port, for converting the intermediate tracking signal to the ET signal.

15. A method of envelope tracking (ET) power supply in a device; the device comprising a radio frequency (RF) module, an envelope tracking module (ETM), a first power amplifier (PA) and a second PA; the RF module comprising a plurality of transmitters, an ET output and an ET multiplexer; each transmitter of the plurality of transmitters comprising an ET port; the ET multiplexer being coupled between the ET output and said ET ports of the plurality of transmitters; the ETM supplying power according to signal obtained from the ET output; the plurality of transmitters including a first transmitter and a second transmitter which comprise a first ET port and a second ET port respectively; and the method comprising:

during a first time interval, by the first transmitter, providing a first RF signal to the first PA to be amplified, and providing a first ET signal, which reflects an envelope of the first RF signal, to the first ET port; and, by the ET multiplexer, relaying the first ET port to the ET output to cause the ETM to supply the first PA according to the first ET signal; and during a second time interval, by the second transmitter, providing a second RF signal to the second PA to be amplified.

16. The method of claim 15, wherein:

the plurality of transmitters further includes a third transmitter which comprises a third ET port; and the method further comprises: during different time intervals, by the ET multiplexer, relaying different ones of the first ET port, the second ET port and the third ET port to the ET output.

17. The method of claim 15 further comprising:

during the first time interval, disabling the second transmitter; and during the second time interval, disabling the first transmitter; by the second transmitter, further providing a second ET signal, which reflects an envelope of the second RF signal, to the second ET port; and, by the ET multiplexer, relaying the second ET port to the ET output to cause the ETM to supply the second PA according to the second ET signal.

18. The method of claim 15 further comprising:

during the first time interval, by the second transmitter, providing the second RF signal to the second PA to be amplified.

19. The method of claim 18, wherein the device further comprises a second power source which supplies the second PA during the first time interval.

20. The method of claim 19, wherein:

the device further comprises a power switch coupled between the ETM, the second power source and the second PA;

during the first time interval, the power switch relays the second power source to the second PA to supply the second PA;

during the second time interval, the power switch relays the ETM to the second PA to supply the second PA; and the method further comprises:

during the second time interval, by the second transmitter, providing a second ET signal, which reflects an envelope of the second RF signal, to the second ET port; and, by the ET multiplexer, relaying the second ET port to the ET output to cause the ETM to supply the second PA according to the second ET signal.

* * * * *